US006358631B1

(12) United States Patent
Forrest et al.

(10) Patent No.: US 6,358,631 B1
(45) Date of Patent: *Mar. 19, 2002

(54) MIXED VAPOR DEPOSITED FILMS FOR ELECTROLUMINESCENT DEVICES

(75) Inventors: Stephen Ross Forrest, Princeton, NJ (US); Mark Edward Thompson, Anaheim Hills, CA (US); Paul Edward Burrows, Princeton; Dennis Matthew McCarty, Southampton, both of NJ (US); Linda Susan Sapochak, Las Vegas, NV (US); Jon Andrew Cronin, Cordova, TN (US)

(73) Assignee: The Trustees of Princeton University, Princeton, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/693,359

(22) Filed: Aug. 6, 1996

Related U.S. Application Data

(63) Continuation-in-part of application No. 08/354,674, filed on Dec. 13, 1994, now Pat. No. 5,707,745.

(51) Int. Cl.$^7$ ............................................. B32B 17/06

(52) U.S. Cl. ..................... 428/690; 313/506; 428/917; 548/359.1; 548/365.1; 548/373.1; 548/377.1

(58) Field of Search .................. 428/690, 423, 428/916, 691, 917; 313/506; 548/359.1, 365.1, 373.1, 377.1; 257/89, 90; 315/169.3

(56) References Cited

U.S. PATENT DOCUMENTS

| 3,261,844 A | * | 7/1966 | Trofimenko ................. 260/310 |
| 3,611,069 A | | 10/1971 | Galginaitis et al. ..... 317/235 R |
| 3,681,381 A | * | 8/1972 | Trofimenko ................. 260/310 |
| 3,783,353 A | | 1/1974 | Pankove ................. 317/235 R |
| 3,840,873 A | * | 10/1974 | Usui .......................... 340/378 |
| 3,875,456 A | | 4/1975 | Kano et al. ................. 313/501 |
| 4,020,389 A | | 4/1977 | Dickson et al. |
| 4,281,053 A | | 7/1981 | Tang et al. |
| 4,291,815 A | | 9/1981 | Gordon et al. |
| 4,298,769 A | | 11/1981 | Richman |
| 4,365,260 A | | 12/1982 | Holonyak, Jr. ................ 357/17 |
| 4,558,171 A | | 12/1985 | Gantley et al. |
| 4,577,207 A | | 3/1986 | Copeland ...................... 357/17 |
| 4,605,942 A | | 8/1986 | Camlibel et al. ............. 357/17 |
| 4,693,777 A | | 9/1987 | Hazano et al. |
| 4,720,432 A | | 1/1988 | VanSlyke et al. |
| 4,769,292 A | * | 9/1988 | Tang et al. .................. 428/690 |
| 4,777,402 A | * | 10/1988 | Mitsumori ................... 313/509 |
| 4,791,075 A | | 12/1988 | Lin |
| 4,885,211 A | | 12/1989 | Tang et al. |
| 4,900,584 A | | 2/1990 | Tuenge et al. ................. 427/66 |
| 4,950,950 A | | 8/1990 | Perry et al. |
| 5,047,687 A | | 9/1991 | VanSlyke |
| 5,059,861 A | | 10/1991 | Littman ....................... 313/503 |
| 5,064,782 A | | 11/1991 | Nishiguchi |
| 5,075,743 A | | 12/1991 | Behfar-Rad ................... 357/17 |
| 5,077,588 A | | 12/1991 | Yamada et al. ................ 357/17 |
| 5,084,650 A | | 1/1992 | Ryu |
| 5,118,986 A | | 6/1992 | Ohnuma et al. |
| 5,144,473 A | | 9/1992 | Gemma et al. .............. 359/270 |
| 5,150,006 A | * | 9/1992 | Van Slyke et al. .......... 313/504 |

(List continued on next page.)

FOREIGN PATENT DOCUMENTS

| EP | 0715803 | 10/1997 |
| JP | 55-41707 | 3/1980 |
| JP | 59-56391 | 3/1984 |
| JP | 63-264692 | 11/1988 |
| JP | 1-225092 | 9/1989 |
| JP | 2-8290 | 1/1990 |
| JP | 3-93736 | 4/1991 |
| JP | 3-187192 | 8/1991 |
| JP | 4-137485 | 5/1992 |
| JP | 5-331460 | 12/1993 |
| JP | 6-1972 | 1/1994 |
| JP | 6-33050 | 2/1994 |
| JP | 6-68977 | 3/1994 |
| JP | 6-172751 | 6/1994 |
| JP | 6-212153 | 8/1994 |
| JP | 6-283267 | 10/1994 |
| JP | 6-302383 | 10/1994 |
| JP | 7-57873 | 3/1995 |
| WO | 95/06400 | 3/1995 |
| WO | WO 96/19792 | 6/1996 |

OTHER PUBLICATIONS

Tang and Van Slyke, Appl. Phys. Letter, 51 (12) 21, p. 913–915, 1987.*
Tang et al., Abstract of J. of Appl. Phys (1989) 65 (9) pp. 3610–3616, 1989.*
Trofimenko, J. Amer. Chem. Soc. vol. 89, pp. 6288–6294 Called JACS, 1967.*

(List continued on next page.)

* cited by examiner

Primary Examiner—Robert A Dawson
Assistant Examiner—D. Aylward
(74) Attorney, Agent, or Firm—Kenyon & Kenyon

(57) ABSTRACT

A light emitting device (LED) structure and devices containing the same in which the LED structure contains a plurality of at least a first and a second light emitting organic device (LED) stacked one upon the other, to form a layered structure, with each LED separated one from the other by a transparent conductive layer to enable each device to receive a separate bias potential to operate to emit light through the stack, at least one of said LED's comprising an emission layer containing an emitting compound, optionally in a matrix of at least one host compound capable of carrying electrons to the emitting compound.

45 Claims, 25 Drawing Sheets

U.S. PATENT DOCUMENTS

| | | | |
|---|---|---|---|
| 5,166,761 A | 11/1992 | Olson et al. | 257/46 |
| 5,216,331 A | 6/1993 | Hosokawa et al. | |
| 5,231,049 A | 7/1993 | Neugebauer et al. | 437/128 |
| 5,276,380 A | 1/1994 | Tang | |
| 5,286,296 A | 2/1994 | Sato et al. | |
| 5,294,869 A | 3/1994 | Tang et al. | 313/504 |
| 5,294,870 A | 3/1994 | Tang et al. | 313/504 |
| 5,315,129 A | 5/1994 | Forrest et al. | 257/21 |
| 5,324,604 A | 6/1994 | Bugner et al. | |
| 5,329,540 A | 7/1994 | Lee et al. | |
| 5,343,050 A | 8/1994 | Egusa et al. | |
| 5,352,543 A | 10/1994 | Ryu | |
| 5,391,896 A | 2/1995 | Wanlass | 257/80 |
| 5,405,709 A | 4/1995 | Littman et al. | |
| 5,405,710 A | 4/1995 | Dodabalapur et al. | 428/690 |
| 5,409,783 A | 4/1995 | Tang et al. | 428/690 |
| 5,416,494 A | 5/1995 | Yokota et al. | |
| 5,424,560 A * | 6/1995 | Van Slyke et al. | |
| 5,427,858 A | 6/1995 | Nakamura et al. | |
| 5,429,884 A | 7/1995 | Namiki et al. | 428/690 |
| 5,449,432 A | 9/1995 | Hanawa | |
| 5,449,564 A | 9/1995 | Nishio et al. | |
| 5,456,988 A | 10/1995 | Sano et al. | |
| 5,457,565 A | 10/1995 | Namiki et al. | 359/273 |
| 5,478,658 A | 12/1995 | Dodabalapur et al. | 428/690 |
| 5,486,406 A | 1/1996 | Shi | |
| 5,505,985 A | 4/1996 | Nakamura et al. | |
| 5,540,999 A | 7/1996 | Yamamoto et al. | |
| 5,552,547 A | 9/1996 | Shi | |
| 5,578,379 A | 11/1996 | Stutzmann et al. | |
| 5,583,350 A | 12/1996 | Norman et al. | |
| 5,598,059 A | 1/1997 | Sun et al. | |
| 5,601,903 A | 2/1997 | Fujii et al. | |
| 5,604,398 A | 2/1997 | Zyung et al. | |
| 5,617,445 A | 4/1997 | Jewell et al. | |
| 5,629,530 A | 5/1997 | Brown et al. | |
| 5,641,611 A | 6/1997 | Shieh et al. | |
| 5,663,573 A | 9/1997 | Epstein et al. | |
| 5,672,938 A | 9/1997 | Jones | |
| 5,703,436 A | 12/1997 | Forrest et al. | |
| 5,707,745 A | 1/1998 | Forrest et al. | |
| 5,719,467 A | 2/1998 | Antoniadis et al. | |
| 5,755,938 A | 5/1998 | Fukui et al. | |
| 5,757,139 A | 5/1998 | Forrest et al. | |
| 5,821,690 A | 10/1998 | Martens et al. | |
| 5,834,130 A | 11/1998 | Kido et al. | |
| 5,834,893 A | 11/1998 | Bulovic et al. | |
| 5,881,089 A | 3/1999 | Berggren et al. | |
| 5,917,280 A | 6/1999 | Barrows et al. | |
| 5,994,835 A | 11/1999 | Wilson et al. | |

OTHER PUBLICATIONS

Garbuzou et al, Photoluminescence . . . , Chem. Phys. Letters, Feb. 1996, pp. 433–437 (Called Chem. Physics Letters.*

Burrows, et al., Electrolumin . . . , Applied Physics Letters 64, Apr. 1994, pp. 2285–2287, Called Appl. Phys. Letters vol. 64.*

Burrows et al., Metalion Dependent . . . Applied Phys Letters 64, pp. 2718–2720 May 1994, Called Appl. Phys. Letters, vol. 64.*

Tang et al., Organic Electroluminescent . . . , Applied Phys. Letters pp. 913–915 Called Appl. Phys. Letters, vol. 51, Sep. 1987.*

P.E. Burrows, L.S. Sapochak, D.M. McCarty, S.R. Forrest, and M.E. Thompson, "Metal Ion Dependent Luninescence Effects in Metal Tris–Quinolate Organic Heterojunction Light Emitting Devices", *Appl. Phys. Lett.*, 64, pp. 2718 (1994).

C.W. Tang and S.A. VanSlyke, "Organic Electroluminescent Diodes", *Appl. Phys. Lett.*, 51, pp. 913 (1987).

N. Takada, T. Tsutsui, and S. Saito, "Strongly Directed Emission from Controlled–Spontaneous–Emission electroluminescent Diodes with Europium Complex as an Emitter", *Japanese J. Appl. Phys.*, p. 33, L863 (1994).

C. Adachi, T. Tsutsui, and S. Saito, "Blue Light–Emitting Organic Electroluminescent Devices", *Appl. Phys. Lett.*, 56, pp. 799 (1990).

P.E. Burrows and S.R. Forest, "Electroluminescence from Trap–Limited Current Transport in Vacuum Deposited Organic Light Emitting Devices", *Appl. Phys. Lett.*, pp. 2285 (1993).

D.Z. Garbuzov, V. Bulovic, P.E. Burrows, and S.R. Forrest, "Photoluminescence Efficiency and Absorption of Aluminum–Tris–Quinolate ($Alq_3$) Thin Films", *Chem. Phys. Lett.*, (1996).

Yuji Hamada, Takeshi Sano, Masayuki Fujita, Takanori Fujii, Yoshitaka Nishio and Kenichi Shibata; "Blue Electroluminescence in Thin Films of Azomethin–Zinc Complexes", *Japanese Journal of Applied Physics*, 1993, vol. 32, pp. L511–L513.

Junji Kido and Katsutoshi Nagai, "Organic Electroluminescent Devices Using Lanthanide Complexes", *Journal of Alloys and Compounds*, 1993, vol. 192, pp. 30–33.

Curtis E. Johnson, Richard Eisenberg, Ted R. Evans, and Mitch S. Burberry, "Luminescent Iridium(I), Rhodium(I), and Platinum(II) Dithiolate Complexes", *Journal of the American Chemical Society*, 1983, vol. 105, pp. 1795–1802.

S.W. Depp and W.E. Howard, "Flat Panel Displays", *Scientific American*, Mar. 1993, pp. 90–97.

K.L. Chopra et al., "Transparent Conductors–A Status Review", *Thin Solid Films*, vol. 102 (1983).

T. Karasawa and Y. Miyata, "Electrical and Optical Properties of Indium Tin Oxide Thin Films Deposited on Unheated Substrates by D.C. Reactive Sputtering", *Thin Solid Films*, vol. 223 (1993).

S.B. Lee et al., "Electronic and Optical Properties of Room Temperature Sputter Deposited Indium Tin Oxide", *J. Vac. Sci. Technol. A*, 11(5), Sep./Oct. 1993.

S. Honda et al., "Oxygen Content of Indium Tin Oxide Films Fabricated by Reactive Sputtering", *J. Vac. Sci. Technol. A*, 13(3), May/Jun. 1995.

K. Sreenivas, et al., "Preparation and Characterization of RF Sputtered Indium Tin Oxide Films", *J. Appl. Phys.*, 57(2), Jan. 15, 1985.

L. R. Gilbert et al., "Comparison of ITO Sputtering Process from a Ceramic and Alloy Targets onto Room Temperature PET Substrates", *Society for Vacuum Pauters*, 36 Conf. Proc., 1993, p. 236.

R.H. Partridge, "Electroluminescence from polyvinylcarbazole films: 3. Electroluminescent devices", *Polymer*, vol. 24, pp. 748–754, Jun. 1983.

Chen and Shi, "Metal Chelates as emitting materials for organic electroluminescence," Coord. Chem. Rev., v.171 (May 1998) pp. 161–174.

Hoshino, et al., "Electroluminescence from triplet excited states of benzophenone," Appl. Phys. Lett., v.69(2) (Jul. 1996) pp. 224–226.

Shoustikov, et al., "Orange and red light–emitting devices . . . ," Synth. Met., v.91(1–3) (May 1997) pp. 217–221.

Frescura, et al., "Large High–Density Monolithic . . . ," IEEE Transactions on Electron Devices, vol. ED–24, No.7 (Jul. 1977) pp. 891–898.

K. Sreenivas et al., "Preparation and Characterization of RF Sputtered Indium Tin Oxide Films", *J. Appl. Phys.*, 57(2), Jan. 15, 1985.

Trofimenko, J. Amer. Chem. Soc., v.89 (1967) pp. 6288–6294.

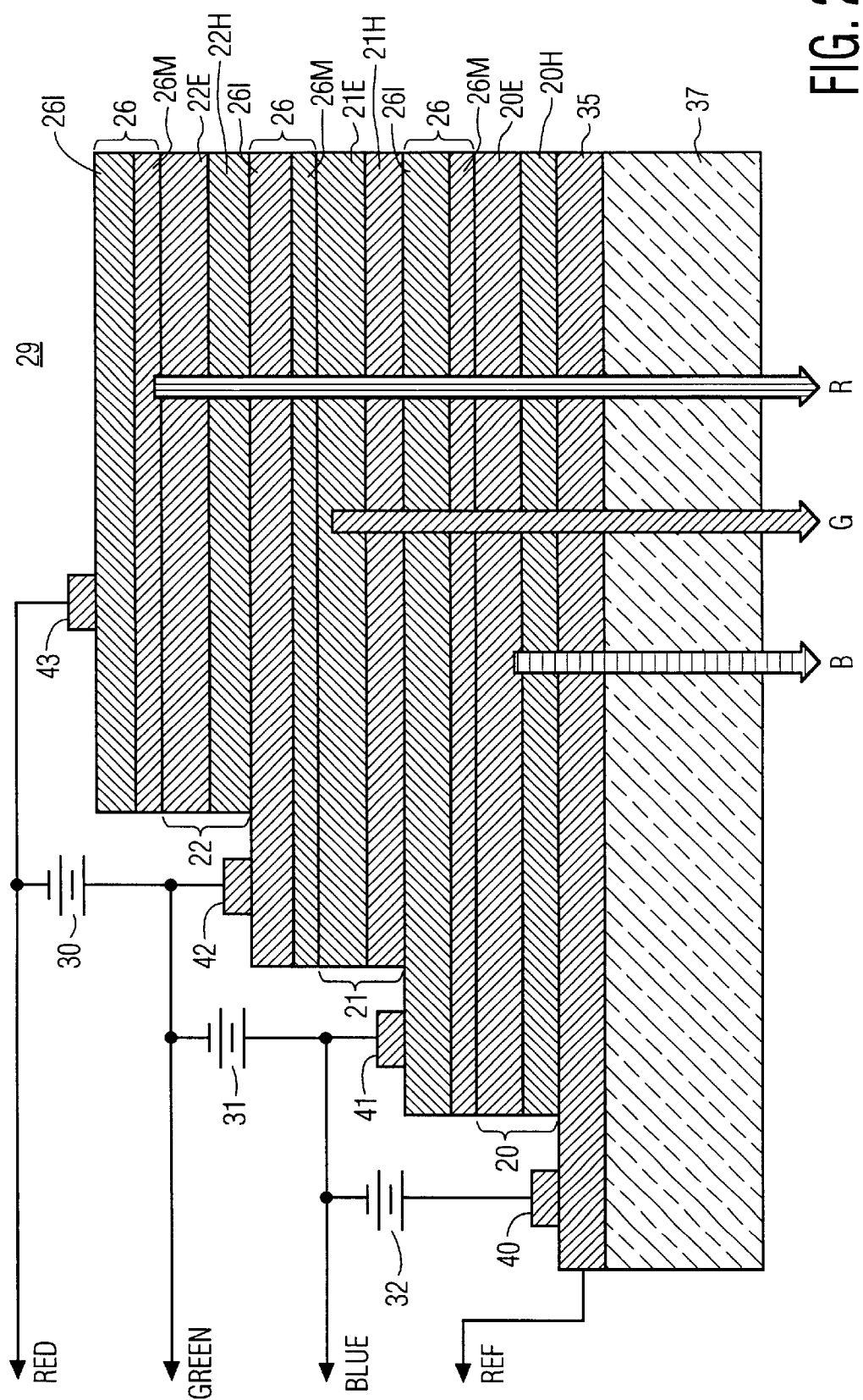

PICOLYKETONE

QUINALDYLKETONE

PHENOXYPYRIDINE 3,5 - di(t-bu)phenol 2,6 - di(t-bu)phenol 2,6 - di(t-bu)crescl

H$_2$Bpz$_2$

MIXED VAPOR DEPOSITED FILMS FOR ELECTROLUMINESCENT DEVICES

RELATED APPLICATION

This is a continuation-in-part application of U.S. Ser. No. 08/354,674, filed on Dec. 13, 1994 now U.S. Pat. No. 5,707,745. Also, this application is related to U.S. Ser. Nos. 08/632,316 and 08/632,322, each filed on Apr. 15, 1996.

GOVERNMENT RIGHTS

This invention was made with Government support under Contract No. F33615-94-1-1414 awarded by DARPA. The government has certain rights in this invention.

FIELD OF THE INVENTION

This invention relates to multicolor organic light emitting devices and more particularly to such devices for use in flat panel electronic displays.

BACKGROUND OF THE INVENTION

The electronic display is an indispensable way in modern society to deliver information and is utilized in television sets, computer terminals and in a host of other applications. No other medium offers its speed, versatility and interactivity. Known display technologies include plasma displays, light emitting diodes (LEDs), thin film electroluminescent displays, and so forth.

The primary non-emissive technology makes use of the electro optic properties of a class of organic molecules known as liquid crystals (LCs) or liquid crystal displays (LCDs). LCDs operate fairly reliably but have relatively low contrast and resolution, and require high power backlighting. Active matrix displays employ an array of transistors, each capable of activating a single LC pixel. There is no doubt that the technology concerning flat panel displays is of a significant concern and progress is continuously being made. See an article entitled "Flat Panel Displays", Scientific American, March 1993, pgs. 90–97 by S. W. Depp and W. E. Howard. In that article, it is indicated that by 1995 flat panel displays alone are expected to form a market of between 4 and 5 billion dollars. Desirable factors for any display technology is the ability to provide a high resolution full color display at good light level and at competitive pricing.

Color displays operate with the three primary colors red (R), green (G) and blue (B). There has been considerable progress in demonstrating red, green and blue light emitting devices (LEDs) using organic thin film materials. These thin film materials are deposited under high vacuum conditions. Such techniques have been developed in numerous places; throughout the world and this technology is being worked on in many research facilities.

Presently, the most favored high efficiency organic emissive structure is referred to as the double heterostructure LED which is shown in FIG. 1A and designated as prior art. This structure is very similar to conventional, inorganic LED's using materials as GaAs or InP.

In the device shown in FIG. 1A, a support layer of glass 10 is coated by a thin layer of Indium Tin Oxide (ITO) 11, where layers 10 and 11 form the substrate. Next, a thin (100–500 Å) organic, predominantly hole transporting layer (HTL) 12 is deposited on the ITO layer 11. Deposited on the surface of HTL layer 12 is a thin (typically, 50 Å–100 Å) emission layer (EL) 13. If the layers are too thin there may be lack of continuity in the film, and thicker films tend to have a high internal resistance requiring higher power operation. Emissive layer (EL) 13 provides the recombination site for electrons injected from a 100–500 Å thick electron transporting layer 14 (ETL) with holes from the HTL layer 12. The ETL material is characterized by its considerably higher electron than hole mobility. Examples of prior art ETL, EL and HTL materials are disclosed in U.S. Pat. No. 5,294,870 entitled "Organic Electroluminescent MultiColor Image Display Device", issued on Mar. 15, 1994 to Tang et al.

Often, the EL layer 13 is doped with a highly fluorescent dye to tune color and increase the electroluminescent efficiency of the LED. The device as shown in FIG. 1A is completed by depositing metal contacts 15, 16 and top electrode 17. Contacts 15 and 16 are typically fabricated from indium or Ti/Pt/Au. Electrode 17 is often a dual layer structure consisting of an alloy such as Mg/Ag 17' directly contacting the organic ETL layer 14, and a thick, high work function metal layer 17" such as gold (Au) or silver (Ag) on the Mg/Ag. The thick metal 17" is opaque. When proper bias voltage is applied between top electrode 17 and contacts 15 and 16, light emission occurs through the glass substrate 10. An LED device of FIG. 1A typically has luminescent external quantum efficiencies of from 0.05 percent to 4 percent depending on the color of emission and its structure.

Another known organic emissive structure referred as a single heterostructure is shown in FIG. 1B and designated as prior art. The difference in this structure relative to that of FIG. 1A, is that the EL layer 13 serves also as an ETL layer, eliminating the ETL layer 14 of FIG. 1A. However, the device of FIG. 1B, for efficient operation, must incorporate an EL layer 13 having good electron transport capability, otherwise a separate ETL layer 14 must be included as shown for the device of FIG. 1A.

Presently, the highest efficiencies have been observed in green LED's. Furthermore, drive voltages of 3 to 10 volts have been achieved. These early and very promising demonstrations have used amorphous or highly polycrystalline organic layers. These structures undoubtedly limit the charge carrier mobility across the film which, in turn, limits current and increases drive voltage. Migration and growth of crystallites arising from the polycrystalline state is a pronounced failure mode of such devices. Electrode contact degradation is also a pronounced failure mechanism.

Yet another known LED device is shown in FIG. 1C, illustrating a typical cross sectional view of a single layer (polymer) LED. As shown, the device includes a glass support layer 1, coated by a thin ITO layer 3, for forming the base substrate. A thin organic layer 5 of spin-coated polymer, for example, is formed over ITO layer 3, and provides all of the functions of the HTL, ETL, and EL layers of the previously described devices. A metal electrode layer 6 is formed over organic layer 5. The metal is typically Mg, Ca, or other conventionally used metals.

An example of a multicolor electroluminescent image display device employing organic compounds for light emitting pixels is disclosed in Tang et al., U.S. Pat. No. 5,294,870. This patent discloses a plurality of light emitting pixels which contain an organic medium for emitting blue light in blue-emitting subpixel regions. Fluorescent media are laterally spaced from the blue-emitting subpixel region. The fluorescent media absorb light emitted by the organic medium and emit red and green light in different subpixel regions. The use of materials doped with fluorescent dyes to emit green or red on absorption of blue light from the blue subpixel region is less efficient than direct formation via green or red LED's. The reason is that the efficiency will be the product of (quantum efficiency for EL)*(quantum efficiency for fluorescence)*(1-transmittance). Thus a drawback of this display is that different laterally spaced subpixel regions are required for each color emitted.

SUMMARY OF THE INVENTION

The present invention is generally directed to a multicolor organic light emitting device and structures containing the same employing an emission layer containing a select group of emitting compounds selected for the transmission of desirable primary colors. The emission layer can optionally contain a matrix formed from host compounds which facilitate the transportation of electrons to the emitting compound.

In one embodiment of the present invention there is provided a multicolor light emitting device (LED) structure, comprising:

a plurality of at least a first and a second light emitting organic device (LED) stacked one upon the other, to form a layered structure, with each LED separated one from the other by a transparent conductive layer to enable each device to receive a separate bias potential to emit light through the stack, at least one of said LED's comprising an emission layer, said emission layer comprising at least one of a) a trivalent metal complex having the formula:

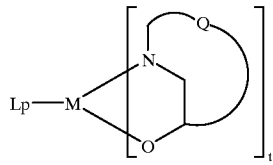

wherein M is a trivalent metal ion; Q is at least one fused ring, at least one of said fused rings containing at least one nitrogen atom; and L is a ligand selected from the group consisting of picolylmethylketone; substituted and unsubstituted salicylaldehyde; a group of the formula $R^1(O)CO$— wherein $R^1$ is selected from the group consisting of hydrogen, an alkyl group, an aryl group, and a heterocyclic group, each of which may be substituted with at least one substituent selected from the group consisting of aryl, halogen, cyano and alkoxy; halogen; a group of the formula $R^1O$— wherein $R^1$ is as defined above; bistriphenyl siloxides; and quinolates and derivatives thereof; p is 1 or 2 and t is 1 or 2 where p does not equal t; and b) a trivalent metal bridged complex having the formula:

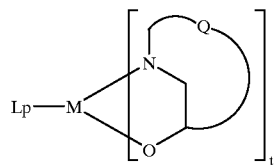

wherein M and Q are defined as above.

In a preferred form of the invention, the multicolor light emitting device (LED) comprises:

a plurality of at least a first and a second light emitting organic device (LED) stacked one upon the other, to form a layered structure, with each LED separated one from the other by a transparent conductive layer to enable each device to receive a separate bias potential to operate to emit light through the stack, at least one of said LED's comprising an emission layer containing
a) a trivalent metal quinolate complex selected from the group consisting of a compound of the following formulas:

1)

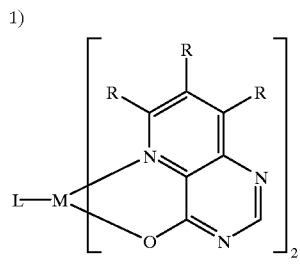

2)

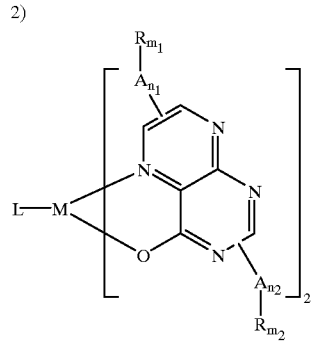

wherein R is selected from the group consisting of hydrogen, an alkyl group, an aryl group, and a heterocyclic group, each of which may be substituted with at least one substituent selected from the group consisting of aryl, halogen, cyano and alkoxy; M is a trivalent metal ion; L is a ligand selected from the group consisting of picolylmethylketone; substituted and unsubstituted salicylaldehyde; a group of the formula $R^1(O)CO$— wherein $R^1$ is selected from the group consisting of hydrogen, an alkyl group, an aryl group, and a heterocyclic group, each of which may be substituted with at least one substituent selected from the group consisting of aryl, halogen, cyano and alkoxy; halogen; a group of the formula $R^1O$— wherein $R^1$ is as defined above; bistriphenyl siloxides; and quinolates and derivatives thereof; A is an aryl group or a nitrogen containing heterocyclic group fused to the existing fused ring structure; $n_1$ and $n_2$ are independently 0, 1 or 2 and $m_1$ and $m_2$ are independently 1, 2, 3 or 4, and b) a trivalent metal bridged quinolate complex of the following formulas:

1)

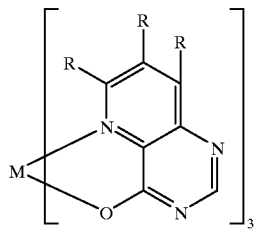

2)

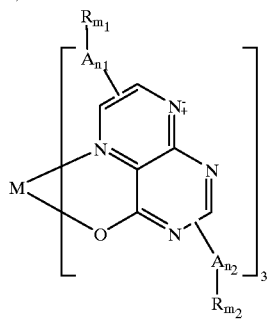

wherein R, M, A, $n_1$, $n_2$, $m_1$ and $m_2$ are as defined above.

In another aspect of the present invention, the multicolor light emitting device (LED) structure comprises:

a plurality of at least a first and a second light emitting organic device (LED) stacked one upon the other, to form a layered structure, with each LED separated one from the other by a transparent conductive layer to enable each device to receive a separate bias potential to emit light through the stack, at least one of said LED's comprising an emission layer, said LED's comprising an emission layer, said emission layer comprising at least one of a) a trivalent metal quinolate complex having the following formula:

1)

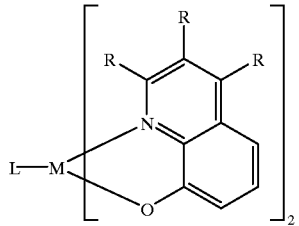

wherein R is selected from the group consisting of hydrogen, an alkyl group, an aryl group, and a heterocyclic group, each of which may be substituted with at least one substituent selected from the group consisting of aryl, halogen, cyano and alkoxy; M is a trivalent metal ion; L is a ligand selected from the group consisting of picolylmethylketone; substituted and unsubstituted salicylaldehyde; a group of the formula $R^1(O)CO$— wherein $R^1$ is selected from the group consisting of hydrogen, an alkyl group, an aryl group, and a heterocyclic group, each of which may be substituted with at least one substituent selected from the group consisting of aryl, halogen, cyano and alkoxy; halogen; a group of the formula $R^1O$— wherein $R^1$ is as defined above; bistriphenyl siloxides and quinolates and derivatives thereof; and b) a trivalent metal bridged quinolate complex of the following formulas:

1)

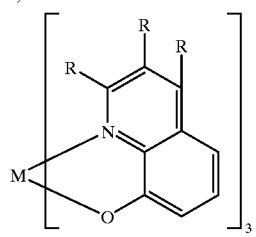

wherein R and M are as defined above, with the proviso that each R can not be hydrogen at the same time.

The multicolor organic light emitting devices of the present invention may optionally contain host compounds which facilitate the carrying of electrons to the emitting compounds to initiate light emission.

The preferred host compounds are set forth below:

a)

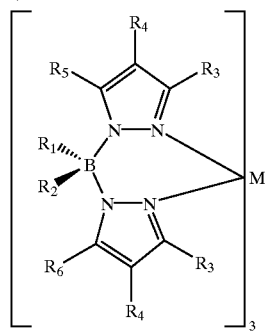

b)

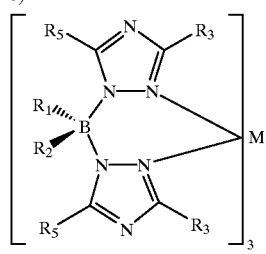

-continued c)

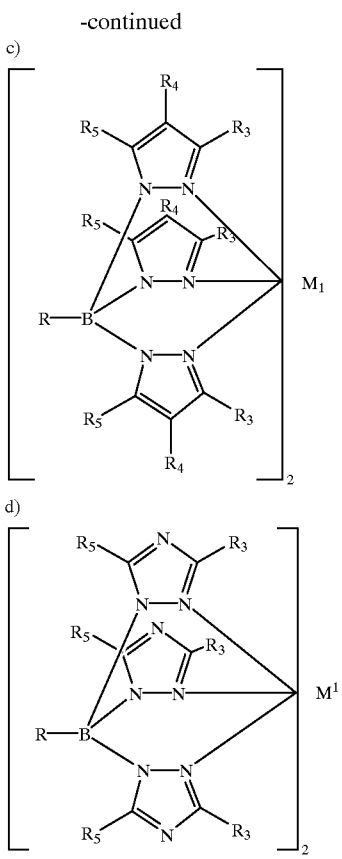

d)

wherein M for compounds represented by formulas (a) and (b) is a +3 metal while $M^1$ for compounds represented by formulas (c) and (d) is a +2 metal; and $R_1$ through $R_5$ are each independently selected from the group consisting of hydrogen, alkyl and aryl.

BRIEF DESCRIPTION OF THE DRAWINGS

The following drawings pertaining to the present invention, in which like reference characters indicate like parts are illustrative of embodiments of the invention and are not intended to limit the scope of the invention as encompassed by the claims forming part of the application.

FIGS. 2A, 2B, and 2C are cross sectional views of an integrated three color pixel utilizing crystalline organic light emitting devices (LED's), respectively, according to embodiments of this invention, respectively.

DETAILED DESCRIPTION OF THE INVENTION

Figure 1A:
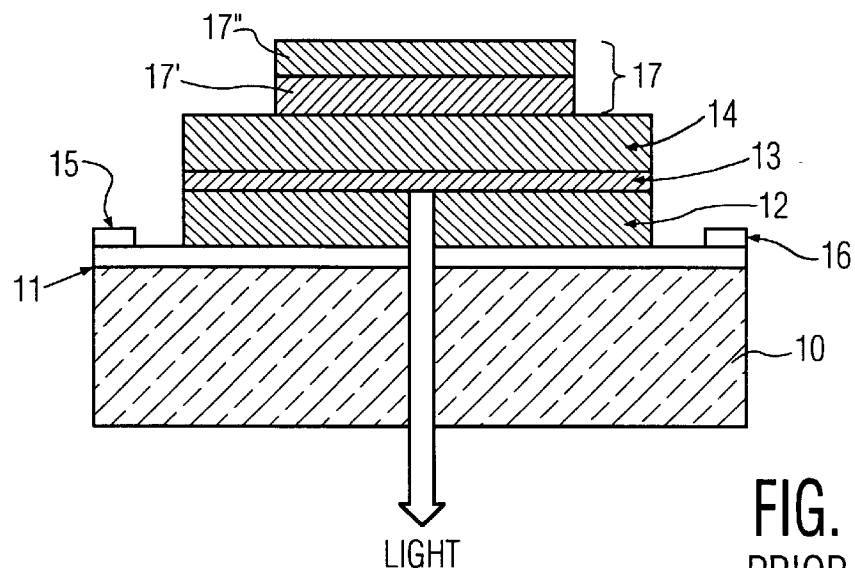
FIG. 1A is a cross sectional view of a typical organic double heterostructure light emitting device (LED) according to the prior art.

FIG. 1A has been described and is a prior art double heterostructure organic light emitting device. The basic construction of the device of FIG. 1A is used in this invention as will be described.

Figure 1B:
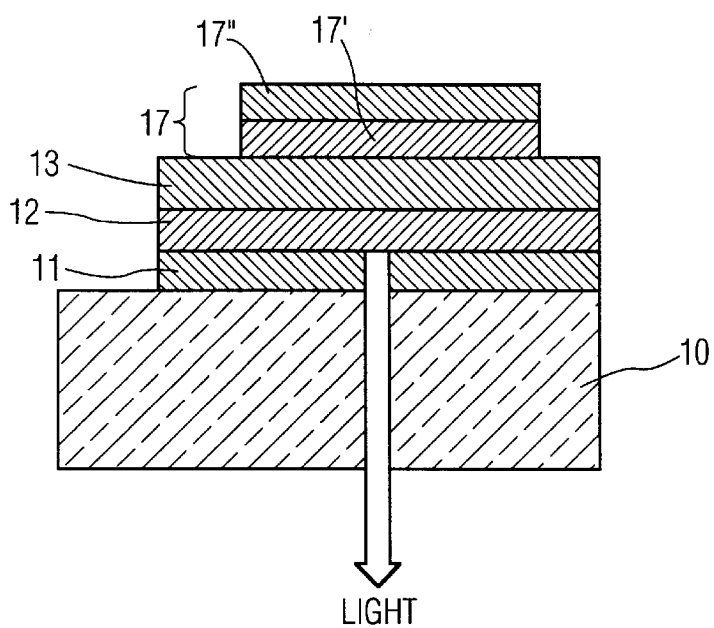
FIG. 1B is a cross sectional view of a typical organic single heterostructure light emitting device (LED) according to the prior art.
Figure 1C:
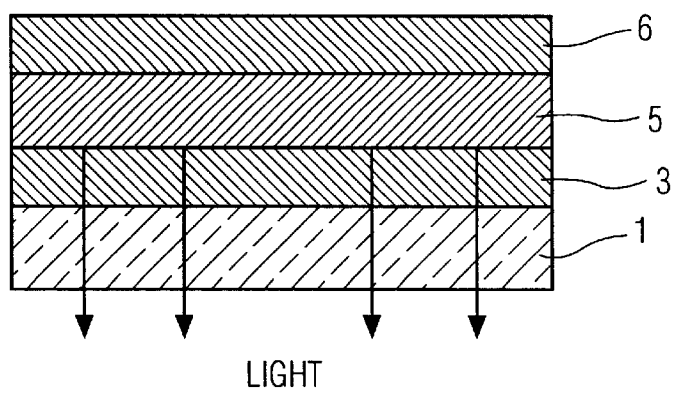
FIG. 1C is a cross sectional view of a known single layer polymer LED structure according to the prior art.
Figure 2A:
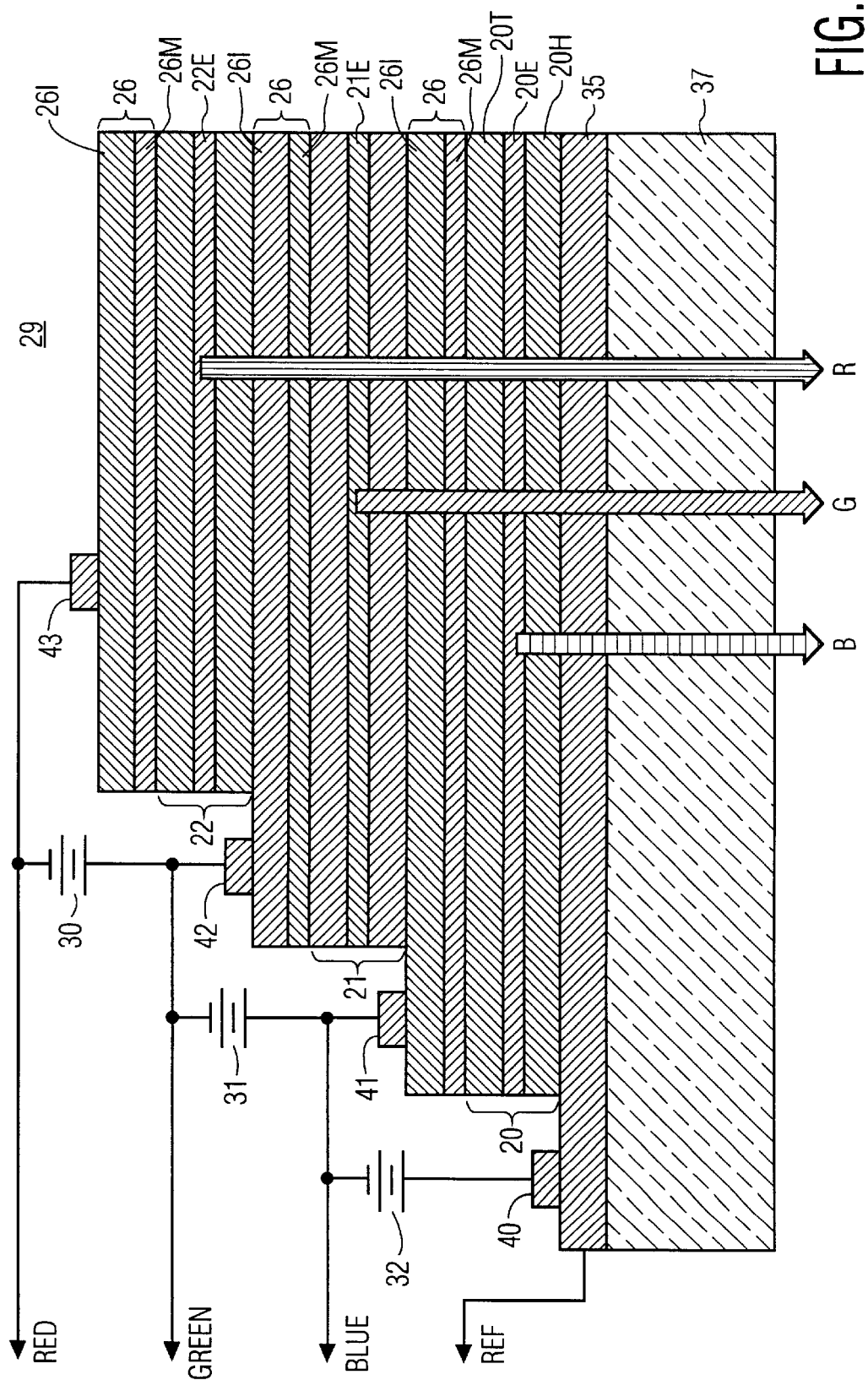

Referring to FIG. 2A, there is shown a schematic cross section of a highly compact, integrated RGB pixel structure which is implemented by grown or vacuum deposited organic layers, in one embodiment of the invention. Based on the ability to grow organic materials on a large variety of materials (including metals and ITO), one can construct a stack of LED double heterostructures (DH) designated as 20, 21 and 22, in one embodiment of the invention. For illustrative purposes, LED 20 is considered in a bottom portion of the stack, LED 21 in a middle portion of the stack, and LED 22 in a top portion of the stack, in the example of FIG. 2A. Also, the stack is shown to be vertically oriented in FIG. 2A, but the LED can be otherwise oriented. In other embodiments, a stack of single heterostructure (SH) LED's (see FIG. 1B), or a stack of polymer-based LED devices (see FIG. 1C), are viable alternatives to the DH LED's, with the SH devices being equally viable as DH devices for light emitters. Also, SH and DH devices comprising a combination of vacuum deposited and polymeric light-emitting materials are considered to be within the spirit and scope of this invention.

Each device structure as device 20, comprises an HTL layer 20H vacuum-deposited or grown on or otherwise deposited onto the surface of an ITO layer 35. A top ETL layer 20T sandwiches an EL layer 20E between the former and HTL layer 20H, for example, shown in the device construction of FIG. 2A. The ETL layer 20T and other ETL layers to be described are composed of organic materials such as M(8-hydroxyquinolate)$_n$ (M=metal ion; n=2–4) which are light emitters. Examples of other suitable organic ETL materials can be found in U.S. Pat. No. 5,294,870 to Tang et al. Formed on top of ETL layer 20T is a thin, semi-transparent low work function (preferably, <4 eV) metal layer 26M having a thickness typically less than 50 Å. Suitable candidates include Mg, Mg/Ag, and As. Deposited on the top of metal layer 26M is another transparent, thin conductive ITO layer 26I. (For convenience herein, the double layer structure of metallic layer 26M and ITO layer 26I is referred to as ITO/metal layers 26.) Each of the double heterostructure devices as 20, 21 and 22 have a bottom HTL layer formed on a transparent conductive layer of ITO 26I or 35. Next an EL layer is deposited and then another layer of ETL. Each of the HTL, ETL, ITO, metal and organic EL layers are transparent because of their composition and minimal thickness. Each HTL layer may be from about 50 to 1000 Å thick; each EL layer may be from about 50 to 200 Å thick; each ETL layer may be from about 50 to 1000 Å thick; each metal layer 26M may be from about 50 to 100 Å thick; and each ITO layer 26I and 35 may be from about 1000 to 4000 Å thick. For optimum performance, each of the layers should preferably be kept towards the lower end of the appropriate range referred to above. Thus, each LED 20, 21 and 22 (excluding ITO/metal layers) are preferably close to about 200 Å thick.

If SH LED devices are used for providing LED's 20, 21, 22, rather than DH LED devices, the ETL and EL layers are provided by a single layer, such as layer 13, as previously described for the SH of FIG. 1B. This layer 13 is typically Al-quinolate. This is shown in FIG. 2B, where the EL layers 20E, 21E, and 22E, respectively, provide both the EL and ETL layer functions. However, an advantage of the DH LED stack of FIG. 2A, relative to a SH LED stack of FIG. 2B, is that the DH LED stack permits thinner overall construction with high efficiency.

In FIGS. 2A and 2B, even though the centers of each of the LED's are offset from one another, the total beam of light from each device is substantially coincident between LED's 20, 21 and 22. While the beams of light are coincident in the concentric configuration, the emitting or non-emitting device closer to the glass substrate will be transparent to the emitting device or devices further away from the glass substrate. However, the diodes 20, 21 and 22 need not be offset from one another and may alternatively be stacked concentrically upon each other, whereupon the beam of light from each device is wholly coincident with the others. A concentric configuration is shown in FIG. 12E which will be described below in regard to device fabrication processes. Note that there is no difference in function between the offset and concentric configurations. Each device emits light through glass substrate 37 in a substantially omnidirectional pattern. The voltages across the three LED's in the stack 29 are controlled to provide a desired resultant emission color and brightness for the particular pixel at any instant of time. Thus, each LED as 22, 21 and 20 can be energized simultaneously with beams as R, G and B, respectively, for example, directed through and visible via the transparent layers, as shown schematically in FIGS. 2A and 2B. Each DH structure 20, 21 and 22 is capable upon application of a suitable bias voltage of emitting a different color light. The double heterostructure LED 20 emits blue light. The double heterostructure LED 21 emits green light while the double heterostructure (DH) LED 22 emits red light. Different combinations or individual ones of LED's 20, 21 and 22 can be activated to selectively obtain a desired color of light for the respective pixel partly dependent upon the magnitude of current in each of the LED's 20, 21 and 22.

In the example of FIGS. 2A and 2B, LED's 20, 21 and 22 are forward biased by batteries 32, 31 and 30, respectively. Current flows from the positive terminal of each battery 32, 31 and 30, into the anode terminal 40, 41, 42, respectively, of its associated LED 20, 21 and 22, respectively, through the layers of each respective device, and from terminals 41, 42 and 43, serving as cathode terminals to negative terminals of each battery 32, 31, and 30, respectively. As a result, light is emitted from each of the LED's 20, 21 and 22. The LED devices 20, 21 and 22 are made selectively energizable by including means (not shown) for selectively switching batteries 32, 31 and 30, respectively, into and out of connection to their respective LED.

In the embodiments of the invention, relative to FIGS. 2A and 2B, the top ITO contact 26I for LED 22 is transparent, making the three color device shown useful for headup display applications. However, in another embodiment of the invention, the top contact 26I is formed from a thick metal, such as either Mg/Ag, In, Ag, or Au, for reflecting light emitted upward back through substrate 13, for substantially increasing the efficiency of the device. Also, overall device efficiency can be increased by forming a multilayer dielectric thin film coating between glass substrate 37 and the ITO layer 35, to provide an anti-reflecting surface. Three sets of anti-reflecting layers are required, one to form an anti-reflection coating at each wavelength emitted from the various layers.

Figure 2C:
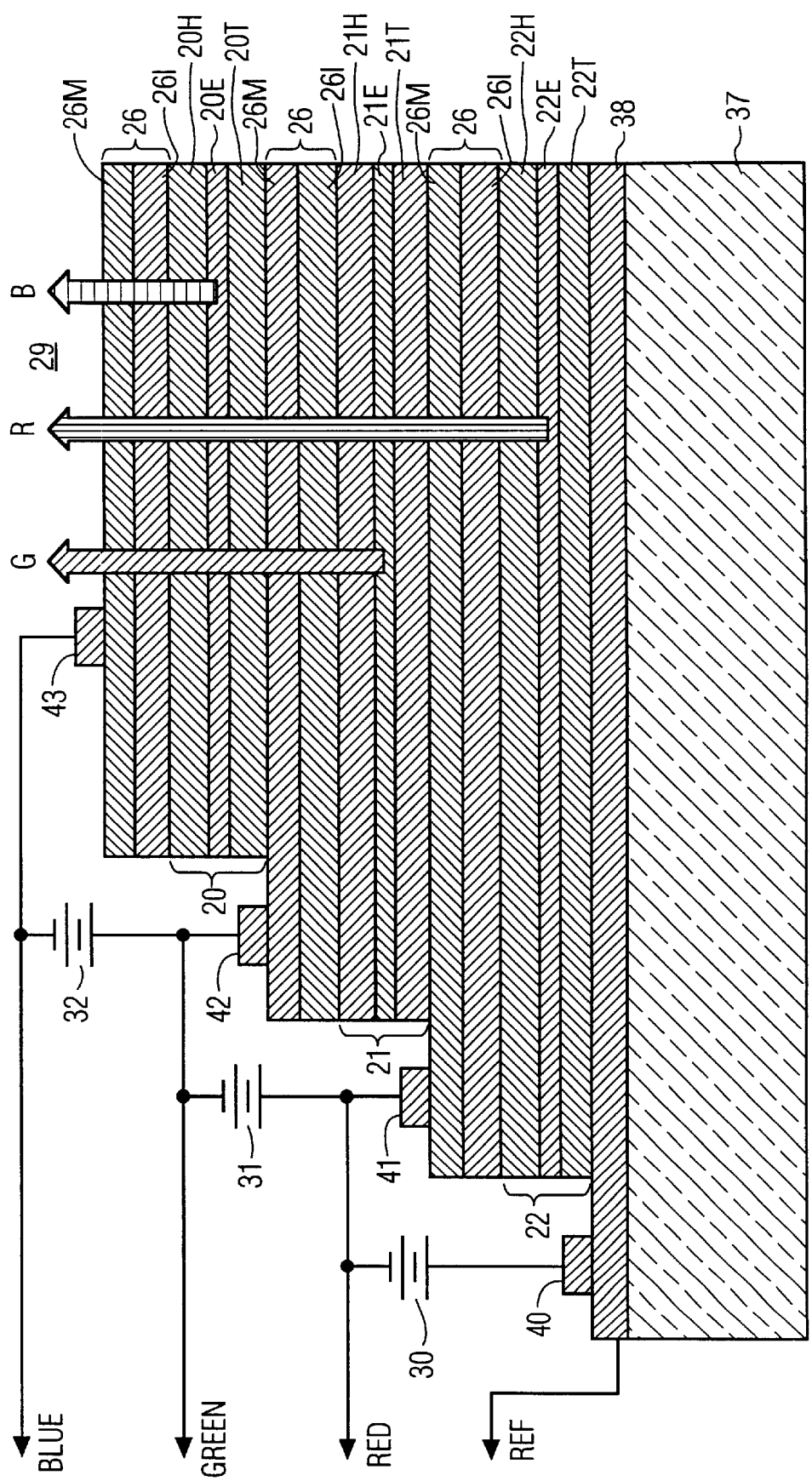

In another embodiment, the device of FIG. 2A is constructed in an opposite or inverted manner, for providing light emission out of the top of stack rather than the bottom as the former. An example of an inverted structure, with reference to FIG. 2C, is to replace ITO layer 35 with a thick, reflective metal layer 38. Blue LED 20 is then provided by interchanging HTL layer 20H and ETL layer 20T, with EL layer 20E remaining sandwiched between the latter two layers. Furthermore, the metal contact layer 26M is now deposited on top of ITO layer 26I. The green LED 21 and red LED 22 portions of the stack are each constructed with inverted layers (the HTL and ETL layers of each are interchanged, followed by inverting the metal and ITO layers) as described for the inverted blue LED 20. Note that in the inverted structure, the blue device 20 must be on top and the red device 22 on the bottom. Also, the polarities of batteries 30, 31, and 32 are reversed. As a result, the current flow through devices 20, 21 and 22, respectively, is in the same direction relative to the embodiment of FIG. 2A, when forward biased for emitting light.

The device in the cross sectional view has a step-like or staircase profile, in this example. The transparent contact areas (ITO) 26I permit separate biasing of each pixel element in the stack and furthermore the material can be used as an etch stop during the processing steps. The separate biasing of each DH LED structure 20, 21 and 22 allows for wavelength tuning of the pixel output to any of various desired colors of the visible spectrum as defined in the CIE (Commission Internationale de l'Eclairage/International Commission of Illumination) chromaticity standard. The blue emitting LED 20 is placed at the bottom of the stack and it is the largest of the three devices. Blue is on the bottom because it is transparent to red and green light. Finally, the materials "partitioning" using the transparent ITO/metal layers 26 facilitates manufacture of this device as will be described. It is the very unique aspects of the vacuum growth and fabrication processes associated with organic compounds which makes the pixel LED devices shown in FIGS. 2A, 2B, and 2C possible. The vertical layering shown in FIGS. 2A, 2B, and 2C allows for the fabrication of three color pixels with the smallest possible area, hence, making these ideal for high definition displays.

As seen in FIGS. 2A, 2B, and 2C, each device DH structure 20, 21 and 22 can emit light designated by arrows B, G and R, respectively, either simultaneously or separately. Note that the emitted light is from substantially the entire transverse portion of each LED 20, 21 and 22, whereby the R, G, and B arrows are not representative of the width of the actual emitted light, respectively. In this way, the addition or subtraction of colors as R, G and B is integrated by the eye causing different colors and hues to be perceived. This is well known in the field of color vision and display calorimetry. In the offset configuration shown, the red, green and blue beams of light are substantially coincident. If the devices are made small enough, that is about 50 microns or less, any one of a variety of colors can be produced from the stack. However, it will appear as one color originating from a single pixel.

The organic materials used in the DH structures are grown one on top of the other or are vertically stacked with the longest wavelength device 22 indicative of red light on the top and the shortest wavelength element 20 indicative of blue light on the bottom. In this manner, one minimizes light absorption in the pixel or in the devices. Each of the DH LED devices are separated by ITO/metal layers 26 (specifically, semitransparent metal layers 26M, and indium tin oxide layers 26I). The ITO layers 26I can further be treated by metal deposition to provide distinct contact areas on the exposed ITO surfaces, such as contacts 40, 41, 42 and 43. These contacts 40, 41, 42 and 43 are fabricated from indium, platinum, gold, silver or alloys such as Ti/Pt/Au, Cr/Au, or Mg/Ag, for example. Techniques for deposition of contacts using conventional metal deposition or vapor deposition are well known. The contacts, such as 40, 41, 42 and 43, enable separate biasing of each LED in the stack. The significant chemical differences between the organic LED materials and the transparent electrodes 26I permits the electrodes to act as etch stop layers. This allows for the selective etching and exposure of each pixel element during device processing.

Each LED 20, 21, 22 has its own source of bias potential, in this example shown schematically as batteries 32, 31, and 30, respectively, which enables each LED to emit light. It is understood that suitable signals can be employed in lieu of the batteries 30, 31, 32, respectively. As is known, the LED requires a minimum threshold voltage to emit light (each DH LED) and hence this activating voltage is shown schematically by the battery symbol.

The EL layers 20E, 21E, 22E may be fabricated from organic compounds selected according to their ability to produce all primary colors and intermediates thereof. The organic compounds are generally selected from trivalent metal complexes and derivatives thereof (e.g. trivalent metal quinolate complexes), trivalent metal bridged complexes and derivatives thereof (e.g. trivalent metal bridged quinolate complexes), Schiff base divalent metal complexes, tin (iv) metal complexes, metal acetylacetonate complexes, metal bidentate ligand complexes, bisphosphonates, divalent metal maleonitriledithiolate complexes, molecular charge transfer complexes, aromatic and heterocyclic polymers and rare earth mixed chelates, as described hereinafter.

Figure 3A:
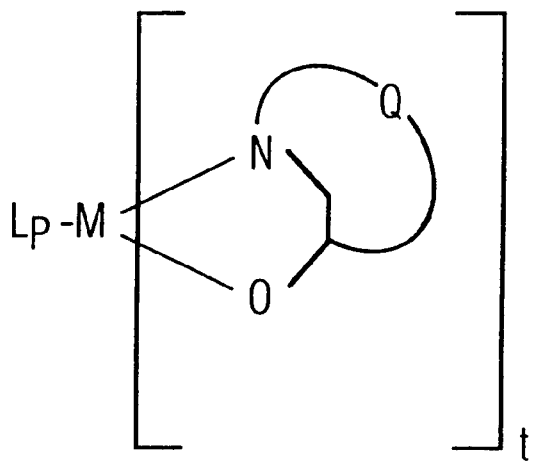
FIGS. 3A–11J are structural formulas of emitting compounds which can be used in the active emission layers to generate the various colors.

The trivalent metal complexes are represented by the structural formula shown in FIG. 3A wherein M is a trivalent metal ion; Q is at least one fused ring with at least one of the fused rings containing at least one nitrogen atom; L is ligand as defined below; p is 1 or 2 and t is 1 or 2 with the proviso that p and t are not the same.

The trivalent metal quinolate complexes are represented by the structural formula shown in FIGS. 3B through 3J, wherein M is a trivalent metal ion selected from Groups 3–13 of the Periodic Table and the Lanthanides. $Al^{+3}$, $Ga^{+3}$ and $In^{+3}$ are the preferred trivalent metal ions.

R of the compounds shown in FIGS. 3B through 3I includes hydrogen, an alkyl group, an aryl group and a heterocyclic group. The alkyl group may be straight or branched chain and preferably has from 1 to 8 carbon atoms. Examples of suitable alkyl groups are methyl and ethyl. The preferred aryl group is phenyl and examples of the heterocyclic group for R include pyridyl, imidazole, furan and thiophene.

The alkyl, aryl and heterocyclic groups of R may be substituted with at least one substituent selected from aryl, halogen, cyano and alkoxy, preferably having from 1 to 8 carbon atoms. The preferred halogen is chloro.

Figure 3B:
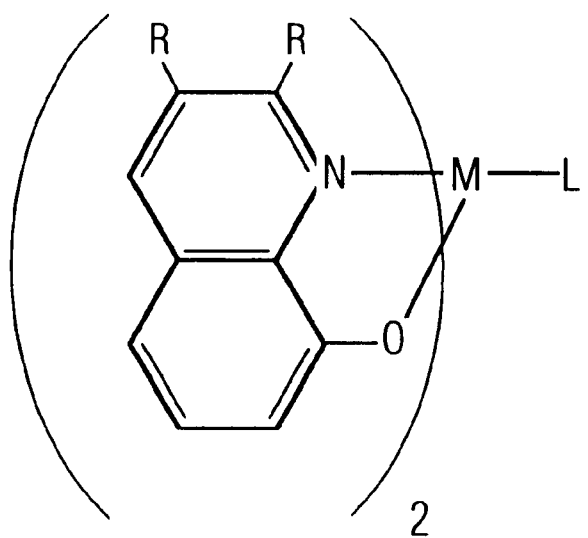

The group L of compounds shown in FIGS. 3A through 3I represents a ligand including picolylmethylketone, substituted and unsubstituted salicylaldehyde (e.g. salicylaldehyde substituted with barbituric acid), a group of the formula $R^1(O)CO$— wherein $R^1$ includes the compounds as defined for R as well as halogen, a group of the formula $R^1O$— wherein $R^1$ is as defined above, bistriphenyl siloxides, and quinolates (e.g. 8-hydroxyquinoline) and derivatives thereof (e.g. barbituric acid substituted quinolates). Preferred complexes covered by the formula shown in FIG. 3B are those where M is $Ga^{+3}$, L is chloro and R is a lower alkyl group. Such compounds generate a blue emission. When M is $Ga^{+3}$ and L is methyl carboxylate, complexes emitting in the blue to blue/green region are produced. A yellow or red emission is expected by using either a barbituric acid substituted salicylaldehyde or a barbituric acid substituted 8-hydroxyquinoline for the L group. Green emissions may be produced by using a quinolate for the L group.

Figure 3C:
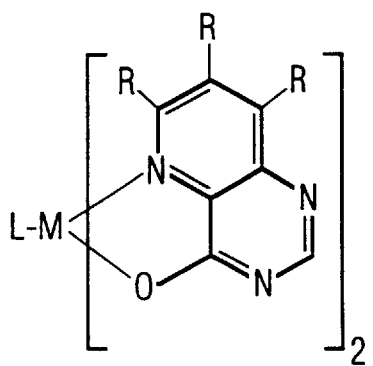

The number of nitrogen atoms and their position in the fused ring structure shown in FIG. 3C can affect the emission spectra. As shown in FIGS. 3C through 3I, the color of light emitted will change according to the presence of nitrogen atoms in the fused ring structure.

More specifically, FIG. 3C shows the presence of nitrogen atoms on the phenoxy side of the compounds which results in a blue emission. This is compared to the compounds of FIG. 3D containing no additional nitrogen atoms in the fused ring. Such compounds emit green light.

Figure 3D:
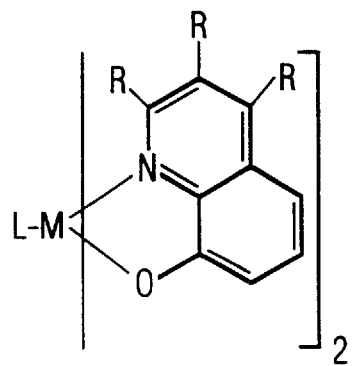
Figure 3E:
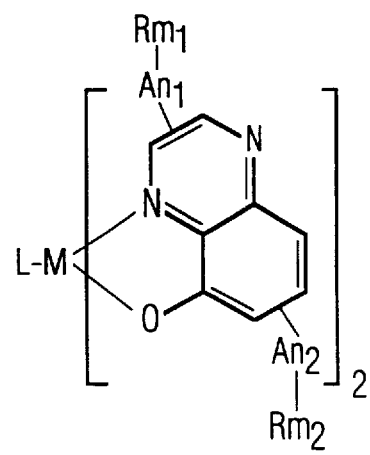
Figure 3F:
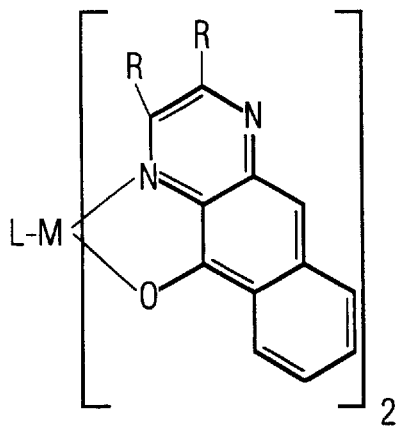
Figure 3G:
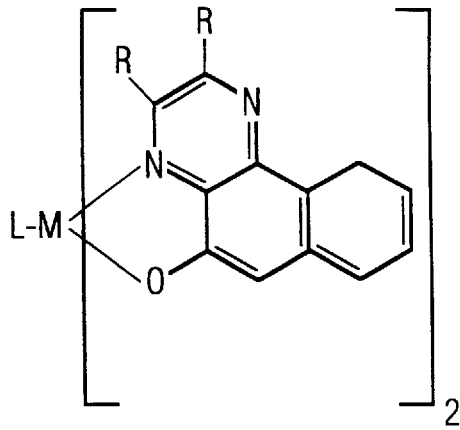
Figure 3H:
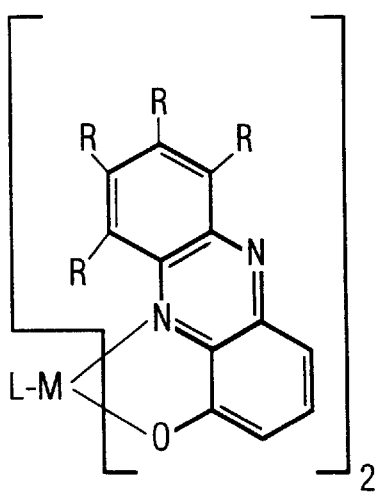
Figure 3I:
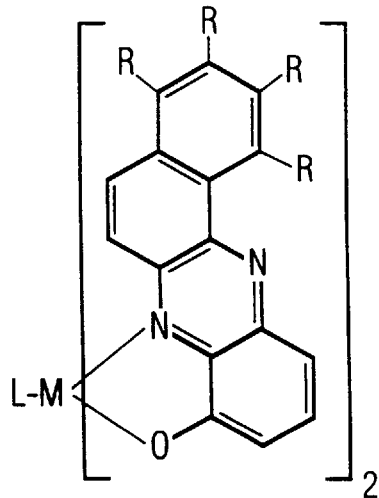
Figure 3J:
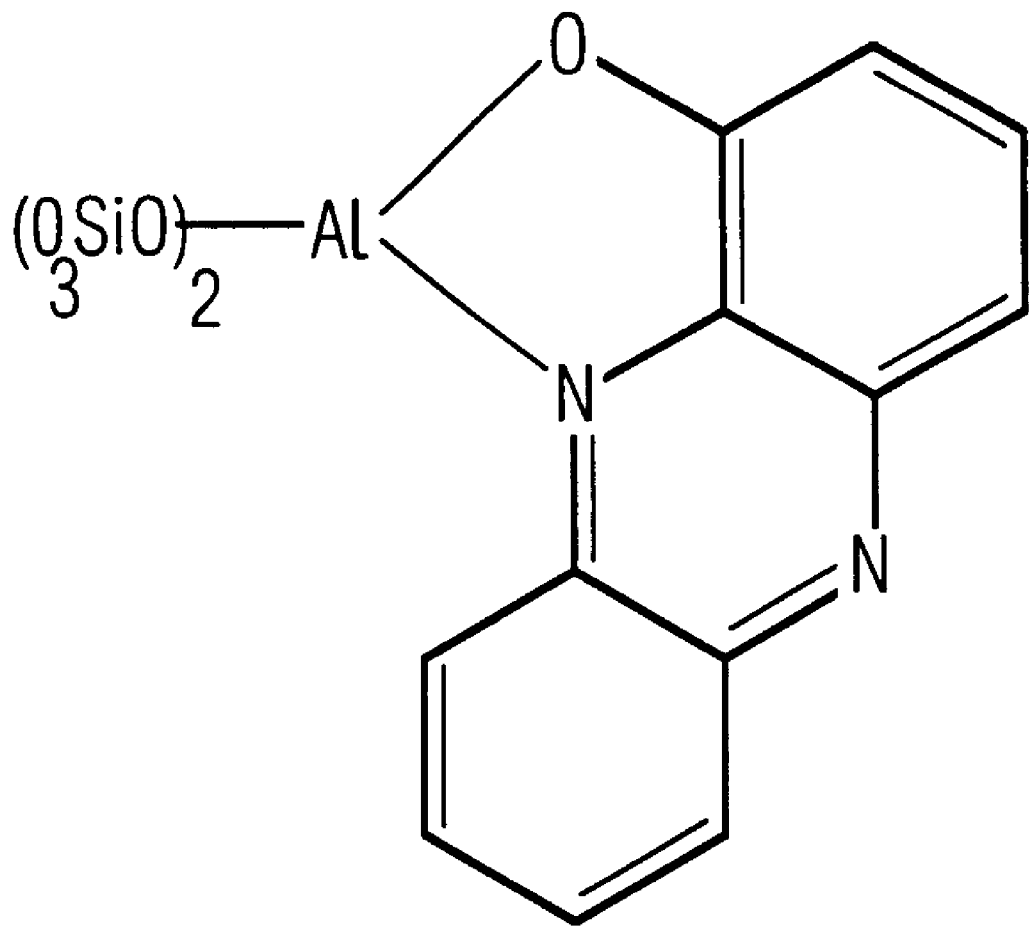

As shown in FIG. 3E the presence of a nitrogen atom in the pyridyl side of the compound results in a shift of emission to orange. Thus, selection of the color of light emitted is made possible by controlling the number and position of nitrogen atoms in the fused ring structure.

Additional emitting compounds are encompassed by the structural formula shown in FIG. 3E wherein A is an aryl group or a nitrogen containing heterocyclic group which is fused to the existing fused ring structure, and $n_1$ and $n_2$ are independently selected from 0, 1 or 2. R is as defined above and $m_1$ and $m_2$ are independently selected from 1, 2, 3 or 4. It will be understood that the R groups are attached to appropriate positions to the aryl group or heterocyclic group represented by A.

Aryl groups for A are preferably 5- and 6-membered rings and include phenyl, substituted phenyl, and fused rings comprised of phenyl groups wherein the substituents are preferably those which do not quench fluorescence. The nitrogen-containing heterocyclic groups for A include unsubstituted and substituted 5- and 6-membered rings.

Examples of the substituents for A include alkyl, alkylamino, ether linkages, cyano and trihaloalkyl (e.g. trifluoroalkyl). A typical aryl group is phenyl and examples of compounds of FIG. 3E wherein $n_1$ and $n_2$ are 1 or 2 are shown in FIGS. 3F through 3J. Each of the compounds shown in FIGS. 3E through 3H is believed to emit red light.

Figure 4A:
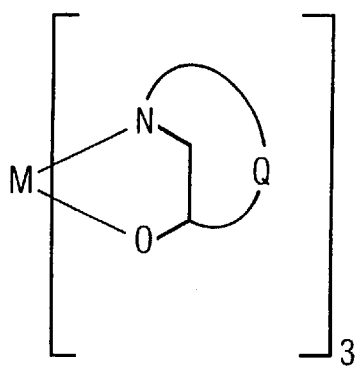
Figure 4B:
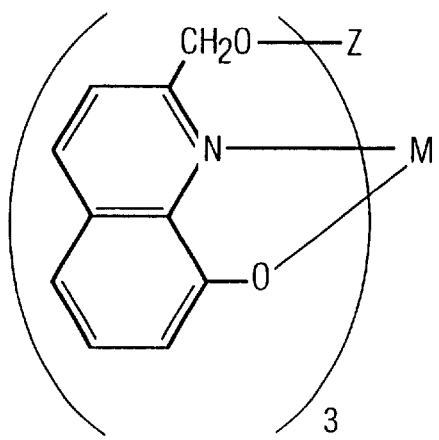
Figure 4C:
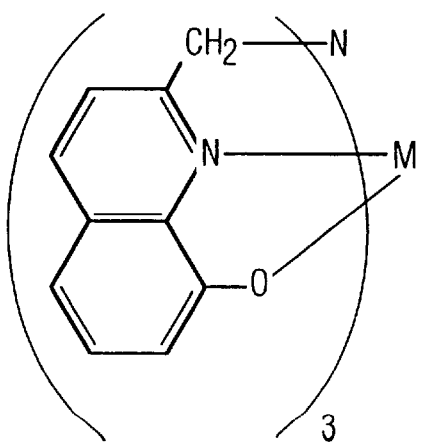
Figure 4D:
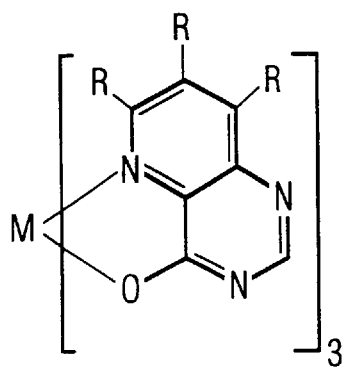
Figure 4E:
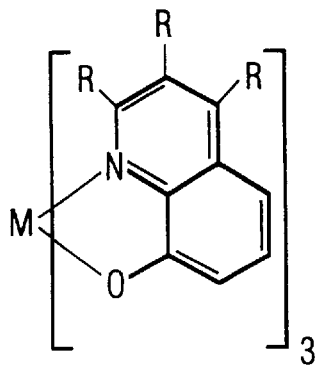
Figure 4F:
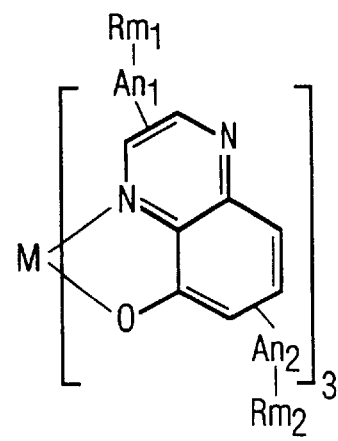
Figure 4G:
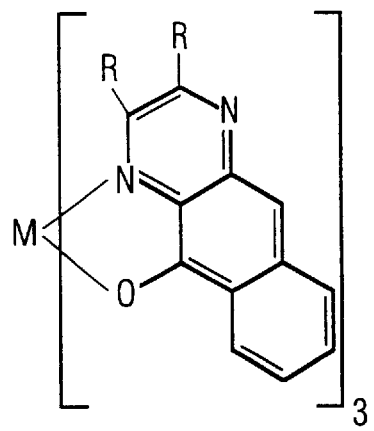
Figure 4H:
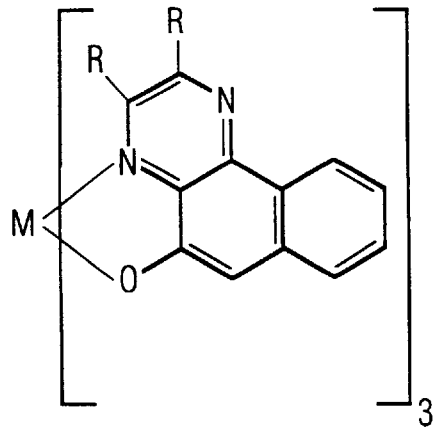

The trivalent metal bridged complexes are shown in FIG. 4A wherein M and Q are defined in the same manner as in the description of the compounds of FIG. 3A.

The trivalent metal bridged quinolate complexes and derivatives thereof which may be employed in the present invention are shown in FIGS. 4B through 4M. These complexes generate green emissions and exhibit superior environmental stability compared to trisquinolates used in prior art devices. The trivalent metal ion M used in these complexes is as defined above with $Al^{+3}$, $Ga^{+3}$, or $In^{+3}$ being preferred. The group Z shown in FIG. 4B has the formula SiR wherein R is as defined above. Z may also be a group of the formula P=O which forms a phosphate.

With respect to the compounds shown in FIGS. 4D through 4M they are similar in structure to the compounds described above in connection with FIGS. 3C through 3J. In particular, the number of nitrogen atoms and their position in the fused ring structures will determine the color of the light emission.

Figure 5A:
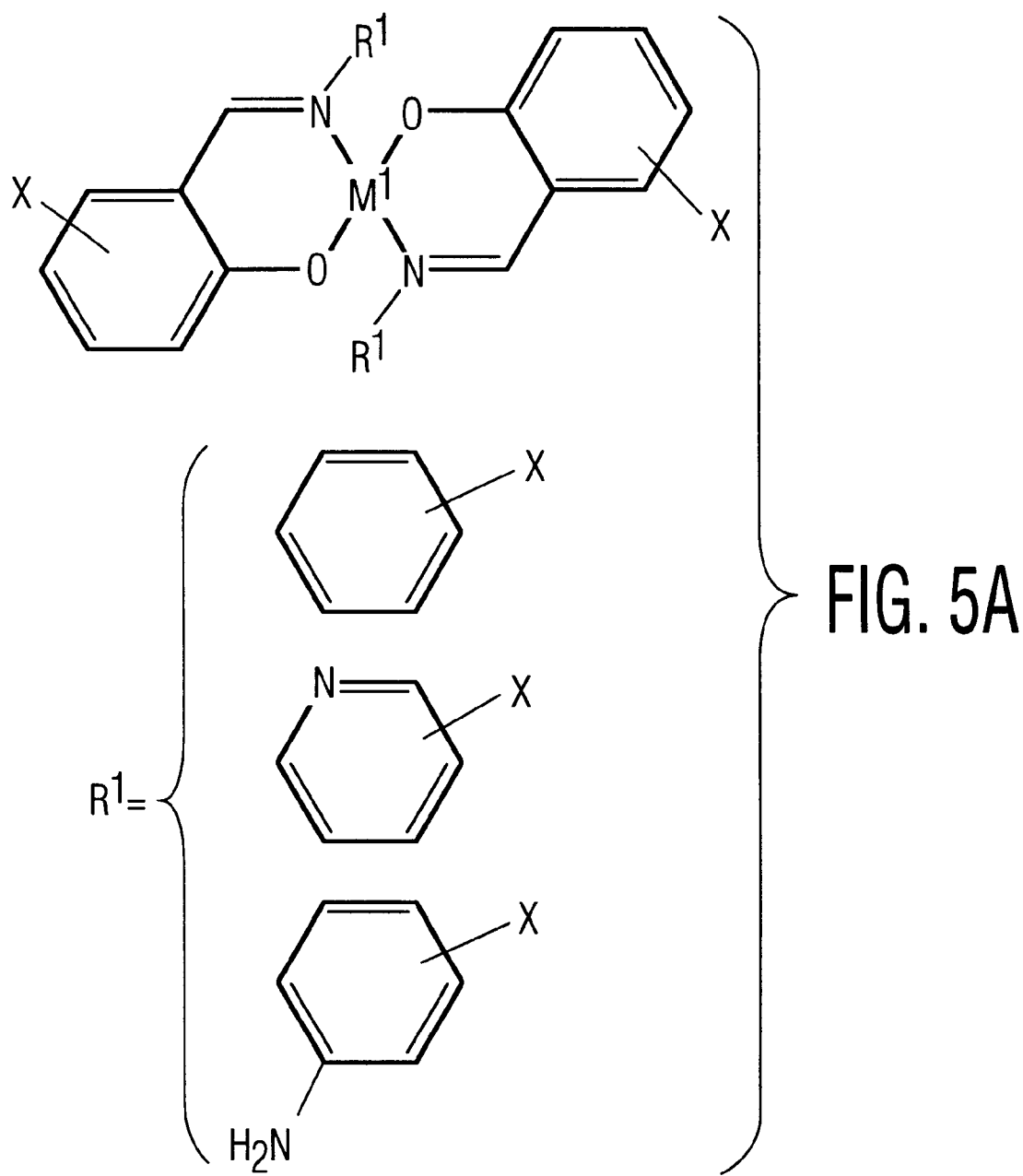
Figure 5B:
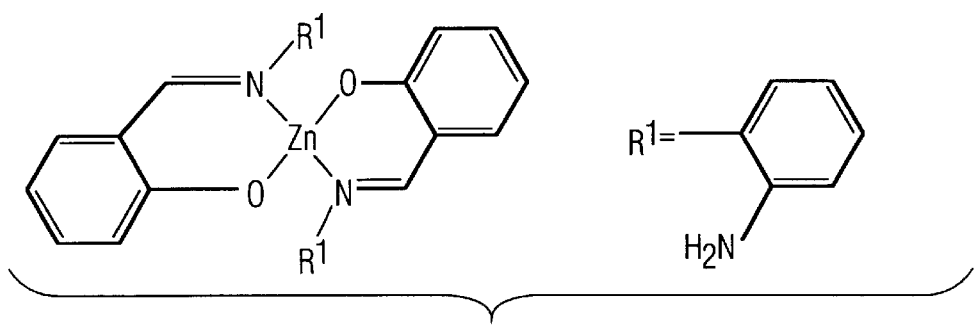

The Schiff base divalent metal complexes include those shown in FIGS. 5A and 5B wherein $M^1$ is a divalent metal chosen from Groups 2–12 of the Periodic Table, preferably Zn (See, Y. Hanada, et al., "Blue Electroluminescence in Thin Films of Axomethin—Zinc Complexes", *Japanese Journal of Applied Physics* Vol. 32, pp. L511–L513 (1993). The group $R^1$ is selected from the structural formulas shown in FIGS. 5A and 5B. The $R^1$ group is preferably coordinated to the metal of the complex through the amine or nitrogen of the pyridyl group. X is selected from hydrogen, alkyl, alkoxy, each having from 1 to 8 carbon atoms, aryl, a heterocyclic group, phosphino, halide and amine. The preferred aryl group is phenyl and the preferred heterocyclic group is selected from pyridyl, imidazole, furan and thiophene. The X groups affect the solubility of the Schiff base divalent metal complexes in organic solvents. The particular Schiff base divalent metal complex shown in FIG. 5B emits at a wavelength of 520 nm.

The tin (iv) metal complexes employed in the present invention in the EL layers generate green emissions. Included among these complexes are those having the formula $SnL^1{}_2L^2{}_2$ where $L^1$ is selected from salicylaldehydes, salicyclic acid or quinolates (e.g. 8-hydroxyquinoline). $L^2$ includes all groups as previously defined for R except hydrogen. For example, tin (iv) metal complexes where $L^1$ is a quinolate and $L^2$ is phenyl have an emission wavelength $(\lambda_{em})$ of 504 nm, the wavelength resulting from measurements of photoluminescence in the solid state.

Figure 6:
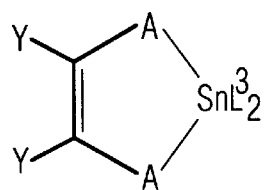

The tin (iv) metal complexes also include those having the structural formula of FIG. 6 wherein A is sulfur or $NR^2$ where $R^2$ is selected from hydrogen and substituted or unsubstituted, alkyl and aryl. The alkyl group may be straight or branched chain and preferably has from 1 to 8 carbon atoms. The preferred aryl group is phenyl. The substituents for the alkyl and aryl groups include alkyl and alkoxy having from 1 to 8 carbon atoms, cyano and halogen. Y is selected from cyano and substituted or unsubstituted phenyl. $L^3$ may be selected from alkyl, aryl, halide, quinolates (e.g. 8-hydroxyquinoline), salicylaldehydes, salicylic acid, and maleonitriledithiolate ("mnt"). When A is S and Y is cyano and $L^3$ is "mnt" an emission between red and orange is expected.

Figure 7:
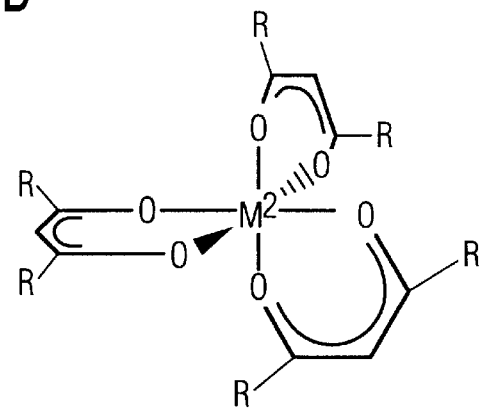

The M(acetylacetonate)$_3$ complexes shown in FIG. 7 generate a blue emission. The metal ion $M^2$ is selected from trivalent metals of Groups 3–13 of the Periodic Table and the Lanthanides. The preferred metal ions are $Al^{+3}$, $Ga^{+3}$ and $In^{+3}$. The group R in FIG. 7 is the same as defined for R in FIG. 3B. For example, when R is methyl, and M is selected from $Al^{+3}$, $Ga^{+3}$ and $In^{+3}$, respectively, the wavelengths resulting from the measurements of photoluminescence in the solid state is 415 nm, 445 nm and 457 nm, respectively (See J. Kido et al., "Organic Electroluminescent Devices using Lanthanide Complexes", *Journal of Alloys and Compounds*, Vol. 92, pp. 30–33 (1993).

The metal bidentate ligand complexes employed in the present invention generally produce blue emissions.

Figure 8A:
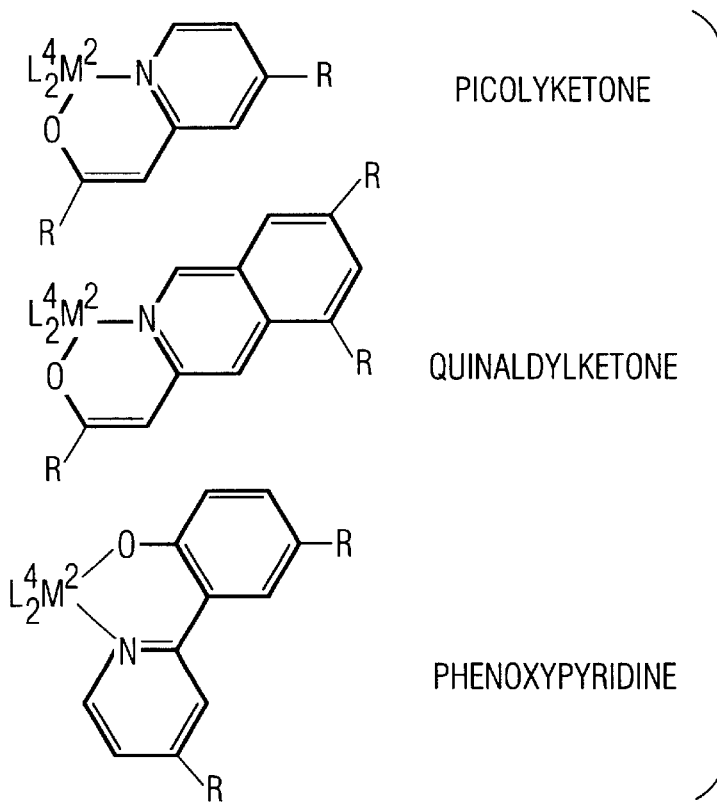
Figure 8B:
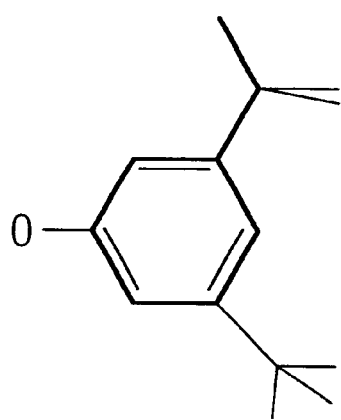
Figure 8C:
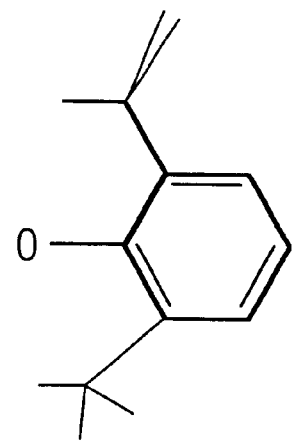
Figure 8D:
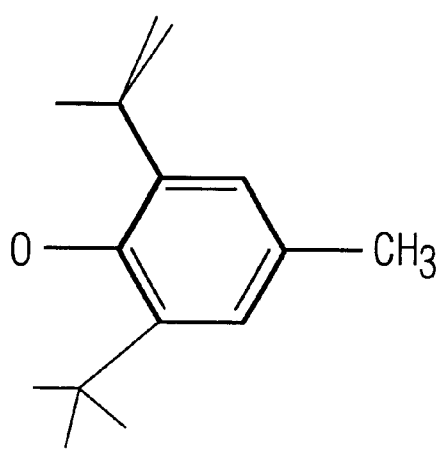
Figure 8E:
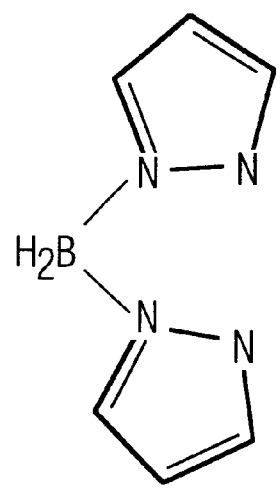

Such complexes have the formula $M^2DL^4{}_2$ wherein M is selected from trivalent metals of Groups 3–13 of the Periodic Table and the Lanthanides. The preferred metal ions are $Al^{+3}$, $Ga^{+3}$, $In^{+3}$ and $Sc^{+3}$. D is a bidentate ligand examples of which are shown in FIG. 8A. More specifically, the bidentate ligand D includes 2-picolylketones, 2-quinaldylketones and 2-(o-phenoxy) pyridine ketones where the R groups in FIG. 8A are as defined above.

The preferred groups for $L^4$ include acetylacetonate; compounds of the formula $OR^3R$ wherein $R^3$ is selected from Si, C and R is selected from the same groups as described above; 3,5-di(t-bu) phenol; 2,6-di(t-bu) phenol; 2,6-di(t-bu) cresol; and $H_2Bpz_2$, the latter compounds being shown in FIGS. 8B–8E, respectively.

By way of example, the wavelength $(\lambda_{em})$ resulting from measurement of photoluminescence in the solid state of aluminum (picolylmethylketone) bis [2,6-di(t-bu) phenoxide] is 420 nm. The cresol derivative of the above compound also measured 420 nm. Aluminum (picolylmethylketone) bis $(OSiPh_3)$ and scandium (4-methoxy-picolylmethylketone) bis (acetylacetonate) each measured 433 nm, while aluminum [2-(O-phenoxy) pyridine] bis [2,6-di(t-bu) phenoxide] measured 450 nm.

Bisphosphonate compounds are another class of compounds which may be used in accordance with the present invention for the EL layers. The bisphosphonates are represented by the general formula:

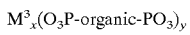

$M^3{}_x(O_3P\text{-organic-}PO_3)_y$ $M^3$ is a metal ion. It is a tetravalent metal ion (e.g. $Zr^{+4}$, $Ti^{+4}$ and $Hf^{+4}$ when x and y both equal 1. When x is 3 and y is 2, the metal ion $M^3$ is in the divalent state and includes, for example, $Zn^{+2}$, $Cu^{+2}$ and $Cd^{+2}$. The term "organic" as used in the above formula means any aromatic or heterocyclic fluorescent compound that can be bifunctionalized with phosphonate groups.

Figure 9A:
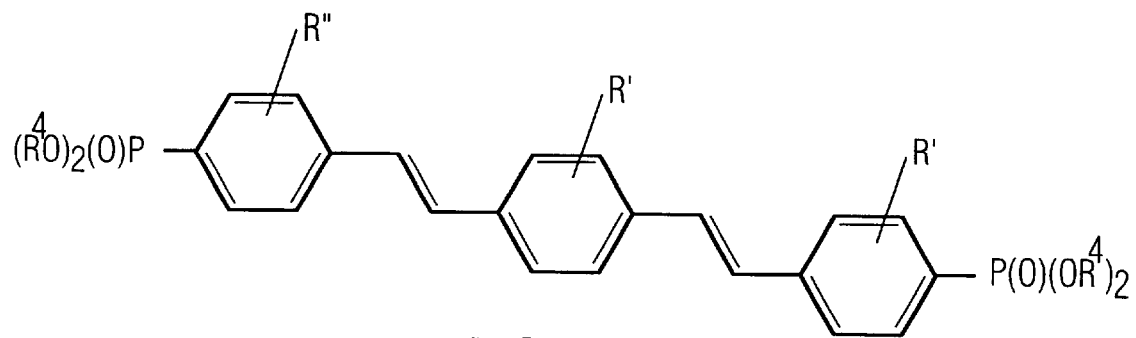
Figure 9B:
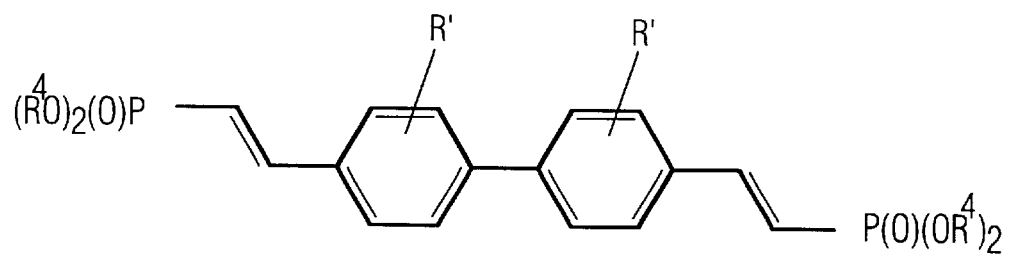

The preferred bisphosphonate compounds include phenylene vinylene bisphosphonates as for example those shown in FIGS. 9A and 9B. Specifically, FIG. 9A shows β-styrenyl stilbene bisphosphonates and FIG. 9B shows 4,4'-biphenyl di(vinylphosphonates) where R is as described previously and $R^4$ is selected from substituted and unsubstituted alkyl groups, preferably having 1–8 carbon atoms, and aryl. The preferred alkyl groups are methyl and ethyl. The preferred aryl group is phenyl. The preferred substituents for the alkyl and aryl groups include at least one substituent selected from aryl, halogen, cyano, alkoxy, preferably having from 1 to 8 carbon atoms.

Figure 10:
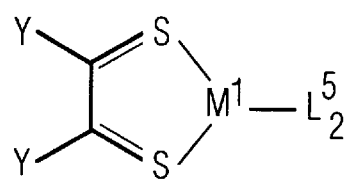

The divalent metal maleonitriledithiolate ("mnt") complexes have the structural formula shown in FIG. 10. The divalent metal ion $M^1$ includes all metal ions having a +2 charge, preferably transition metal ions such as $Pt^{+2}$, $Zn^{+2}$ and $Pd^{+2}$. Y is selected from cyano and substituted or unsubstituted phenyl. The preferred substituents for phenyl are selected from alkyl, cyano, chloro and 1,2,2-tricyanovinyl.

$L^5$ represents a group having no charge. Preferred groups for $L^5$ include $P(OR)_3$ and $P(R)_3$ where R is as described above or $L^5$ may be a chelating ligand such as, for example, 2,2'-dipyridyl; phenanthroline; 1,5-cyclooctadiene; or bis (diphenylphosphino)methane.

Illustrative examples of the emission wavelengths of various combinations of these compounds are shown in Table 1, as derived from C. E. Johnson et al., "Luminescent Iridium(I), Rhodium(I), and Platinum(II) Dithiolate Complexes", *Journal of the American Chemical Society*, Vol. 105, pg. 1795 (1983).

TABLE 1

| Complex | Wavelength* |
|---|---|
| [Platinum(1,5-cyclooctadiene) (mnt)] | 560 nm |
| [Platinum(P(OEt)$_3$)$_2$(mnt)] | 566 nm |
| [Platinum(P(OPh)$_3$)$_2$(mnt)] | 605 nm |
| [Platinum(bis(diphenylphosphino)methane) (mnt)] | 610 nm |
| [Platinum(PPh$_3$)$_2$(mnt)] | 652 nm |

*wavelength resulting from measurement of photoluminescence in the solid state.

Figure 11A:
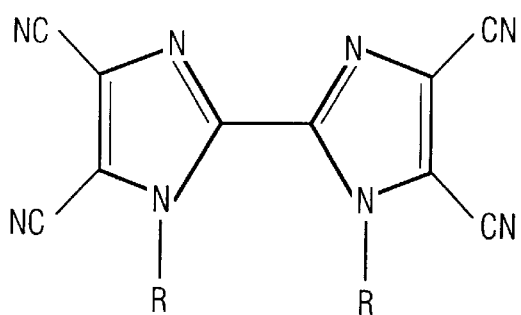
Figure 11B:
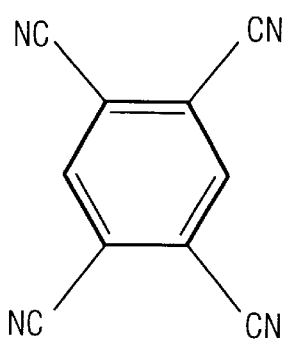
Figure 11C:
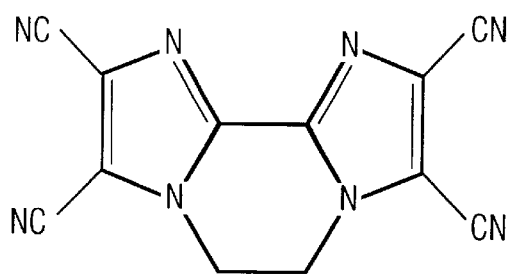
Figure 11D:
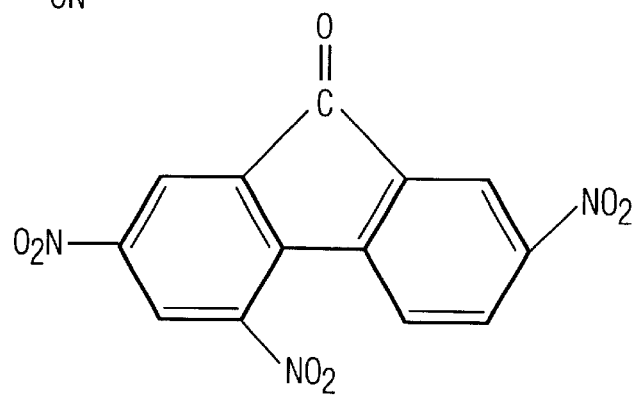
Figure 11E:
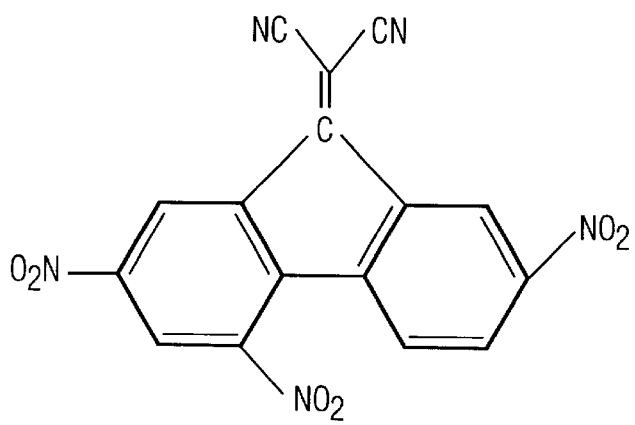
Figure 11F:
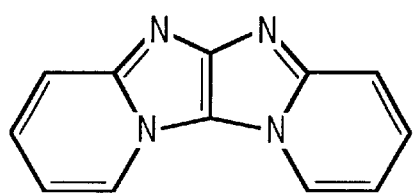
Figure 11G:
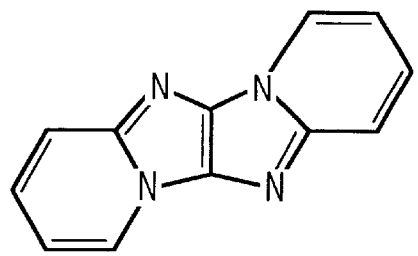
Figure 11H:
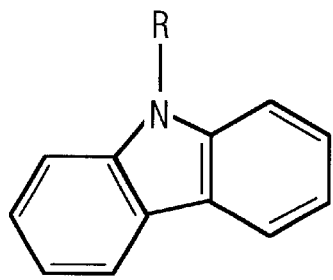
Figure 11I:
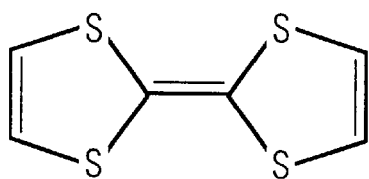
Figure 11J:
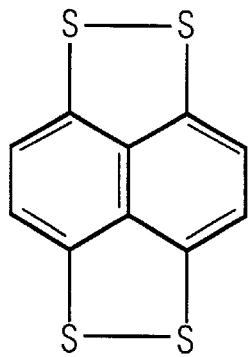

Molecular charge transfer complexes employed in the present invention for the EL layers are those including an electron acceptor structure complexed with an electron donor structure. FIGS. 11A–11E show a variety of suitable electron acceptors which may form a charge transfer complex with one of the electron donor structures shown in FIGS. 11F–11J. The group R as shown in FIGS. 11A and 11H is the same as described above.

Films of these charge transfer materials are prepared by either evaporating donor and acceptor molecules from separate cells onto the substrate, or by evaporating the pre-made charge transfer complex directly. The emission wavelengths may range from red to blue, depending upon which acceptor is coupled with which donor.

Polymers of aromatic and heterocyclic compounds which are fluorescent in the solid state may be employed in the present invention for the EL Layers. Such polymers may be used to generate a variety of different colored emissions. Table II provides examples of suitable polymers and the color of their associated emissions.

TABLE II

| POLYMER | EMISSION COLOR |
|---|---|
| poly(para-phenylenevinylene) | blue to green |
| poly(dialkoxyphenylenevinylene) | red/orange |
| poly(thiophene) | red |
| poly(phenylene) | blue |
| poly(phenylacetylene) | yellow to red |
| poly(N-vinylcarbazole) | blue |

The rare earth mixed chelates for use in the present invention include any lanthanide elements (e.g. La, Pr, Nd, Sm, Eu, and Tb) bonded to a bidentate aromatic or heterocyclic ligand. The bidentate ligand serves to transport carriers (e.g. electrons) but does not absorb the emission energy. Thus, the bidentate ligands serve to transfer energy to the metal. Examples of the ligand in the rare earth mixed chelates include salicylaldehydes and derivatives thereof, salicyclic acid, quinolates, Schiff base ligands, acetylacetonates, phenanthroline, bipyridine, quinoline and pyridine.

The hole transporting layers 20H, 21H and 22H may be comprised of a porphyrinic compound. In addition, the hole transporting layers 20H, 21H and 22H may have at least one hole transporting aromatic tertiary amine which is a compound containing at least one trivalent nitrogen atom that is bonded only to carbon atoms, at least one of which is a member of an aromatic ring. For example, the aromatic tertiary amine can be an arylamine, such as a monoarylamine, diarylamine, triarylamine, or a polymeric arylamine. Other suitable aromatic tertiary amines, as well as all porphyrinic compounds, are disclosed in Tang et al., U.S. Pat. No. 5,294,870, the teachings of which are incorporated herein in their entirety by reference, provided any of such teachings are not inconsistent with any teaching herein.

Figure 17A:
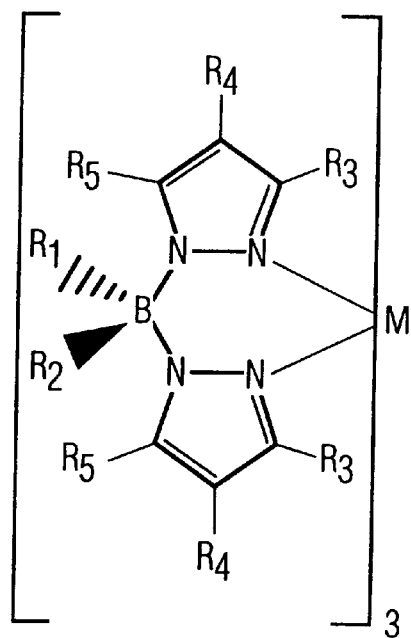
FIGS. 17A–17D are structural formulas of host compounds which can be used in the active emission layers as a matrix for the emitting compounds.

In a preferred form of the invention, the aforementioned and described emitting compounds represented by FIGS. 3A through 3J and FIGS. 4A through 4M are dissolved in a matrix comprised of at least one host compound. The host compounds facilitate the carrying of electrons to the emitting compounds to initiate light emission. Suitable host compounds include metal bis and/or tris substituted borate complexes. The preferred host compounds are selected from metal tris(dihydro bis (1-pyrazolyl) borates) shown in FIG. 17A wherein M is a +3 metal, preferably a Group 13 metal and R$_1$ through R$_5$ are selected from the group consisting of hydrogen, an alkyl group and an aryl group. The preferred aryl group is phenyl.

Figure 17B:
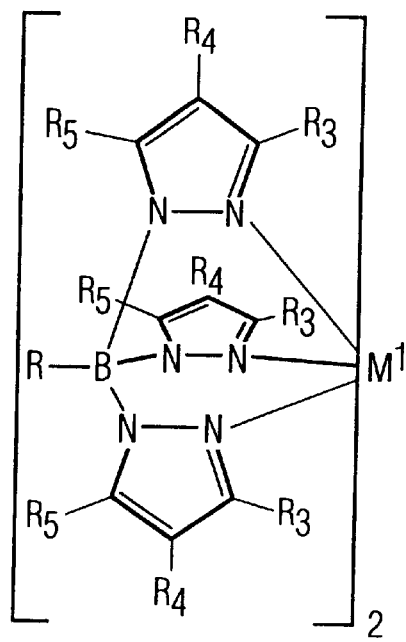
Figure 17C:
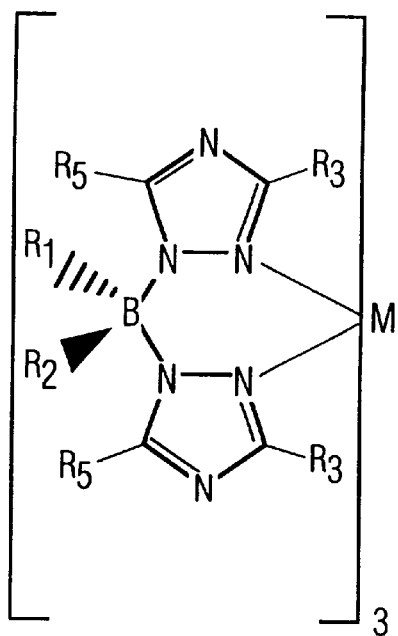
Figure 17D:
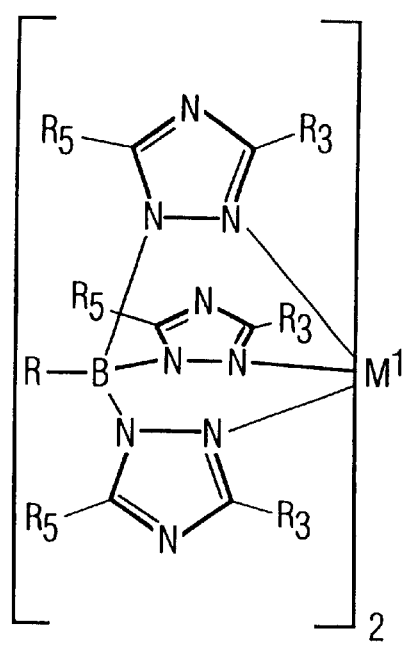

Host compounds also include metal bis(hydro tris(1-pyrazolyl) borates) of the type shown in FIG. 17B wherein M$^1$ is a +2 metal, preferably a Group 12 metal and R$_1$ through R$_5$ are as defined above, as well as metal tris (dihydro bis(1,2,4-triazol-1-yl) borates) where M is a +3 metal, preferably a Group 13 metal and R$_1$ through R$_5$ are as defined above, as shown in FIG. 17C. Metal bis(hydro tris (1,2,4-triazol-1-yl) borates) wherein M$^1$ is a +2 metal, preferably a Group 12 metal and R$_1$ through R$_5$ are as defined above are also included and such compounds are represented by the structural formula shown in FIG. 17D.

The mole % ratio of the emitting compounds to the host compounds employed in the devices of the present invention is generally in the range of 0.01 to 50.

The host compounds can be prepared, for example, by the process disclosed in S. Trofimenko *J. Am. Chem. Soc.*, Vol. 89, p. 6288–6293 (1967). More specifically the diphenyl-bis (1-pyrazolyl) borate ligand is prepared by treating sodium tetraphenylborate with excess equivalents of pyrazole at elevated temperatures. The excess pyrazole is removed by washing the crude product with hexane, followed by sublimation at 190° C. The aluminum complex is prepared by treating aluminum sulfate with three equivalents of the ligand in water. The product precipitates immediately as a white powder.

The fabrication of a stacked organic LED tricolor pixel according to the present invention may be accomplished by either of two processes: a shadow masking process or a dry etching process. Both processes to be described assume, for illustrative purposes, a double heterostructure LED construction, i.e., utilizing only one organic compound layer for each active emission layer, with light emerging from the bottom glass substrate surface. It should be understood that multiple heterojunction organic LED's having multiple organic compound layers for each active emission layer, and/or inverted structures (with light emerging from the top surface of the stack) can also be fabricated by one skilled in the art making slight modifications to the processes described.

The shadow masking process steps according to the present invention are illustrated in FIGS. 12 (A–E). A glass substrate 50 to be coated with a layer of ITO 52 is first cleaned by immersing the substrate 50 for about five minutes in boiling trichloroethylene or a similar chlorinated hydrocarbon. This is followed by rinsing in acetone for about five minutes and then in methyl alcohol for approximately five minutes. The substrate 50 is then blown dry with ultrahigh purity (UHP) nitrogen. All of the cleaning solvents used are preferably "electronic grade". After the cleaning procedure, the ITO layer 52 is formed on substrate 50 in a vacuum using conventional sputtering or electron beam methods.

A blue emitting LED 55 (see FIG. 12B) is then fabricated on the ITO layer 52 as follows. A shadow mask 73 is placed on predetermined outer portions of the ITO layer 52. The shadow mask 73 and other masks used during the shadow masking process should be introduced and removed between process steps without exposing the device to moisture, oxygen and other contaminants which would reduce the operational lifetime of the device. This may be accomplished by changing masks in an environment flooded with nitrogen or an inert gas, or by placing the masks remotely onto the device surface in the vacuum environment by remote handling techniques. Through the opening of mask 73, a 50–100 Å thick hole transporting layer (HTL) 54 and 50–200 Å thick blue emission layer (EL) 56 (shown in FIG. 12B) are sequentially deposited without exposure to air, i.e., in a vacuum. An electron transporting layer (ETL) 58 having a thickness preferably of 50–1000 Å is then deposited on EL 56. ETL 58 is then topped with a semitransparent metal layer 60M which may preferably consist of a 10% Ag in 90% Mg layer, or other low work function metal or metal alloy layer, for example. Layer 60M is very thin, preferably less than 100 Å. Layers 54, 56, 58 and 60M may be deposited by any one of a number of conventional directional deposition techniques such as vapor phase deposition, ion beam deposition, electron beam deposition, sputtering and laser ablation.

An ITO contact layer 60I of about 1000–4000 Å thick is then formed on the metal layer 60M by means of conventional sputtering or electron beam methods. For convenience herein, the sandwich layers 60M and 60I will be referred to and shown as a single layer 60, which is substantially the same as the layer 26 of FIG. 2. The low work function metal portion 60M of each layer 60 directly contacts the ETL layer beneath it, while the ITO layer 60I contacts the HTL layer immediately above it. Note that the entire device fabrication process is best accomplished by maintaining the vacuum throughout without disturbing the vacuum between steps.

Figure 12A:
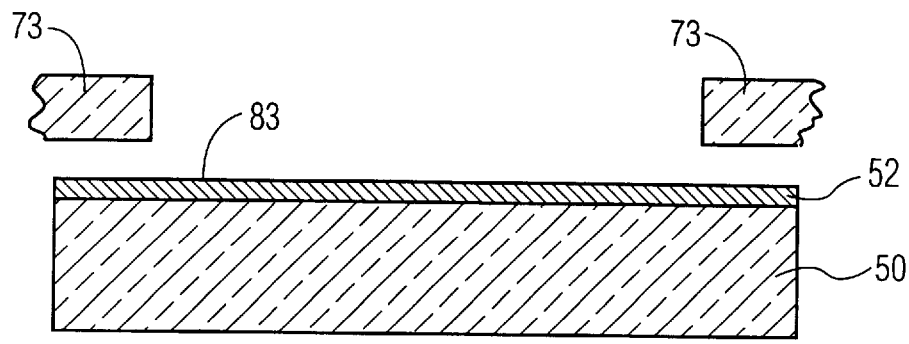
FIGS. 12(A–E) illustrate a shadow masking process for the fabrication of the multicolor LED according to the invention.
Figure 12B:
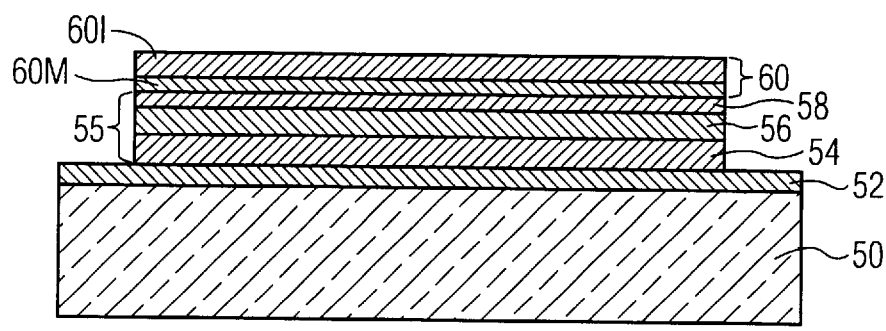
Figure 12C:
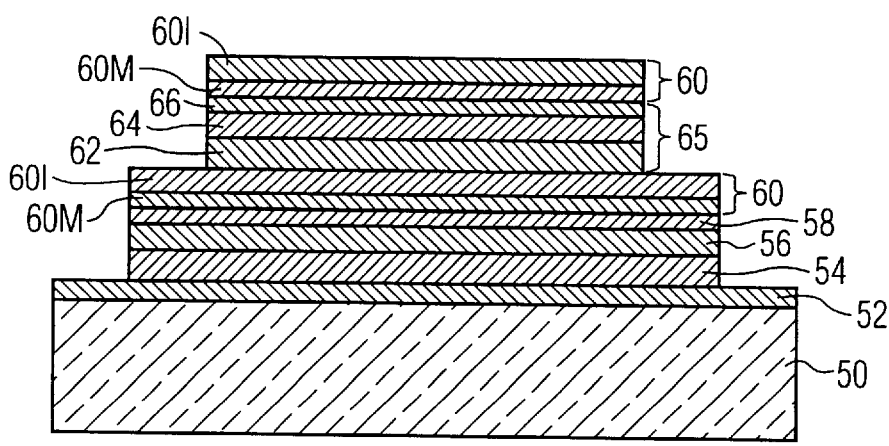

FIG. 12C shows a green emitting LED 65 which is fabricated on top of layer 60 using substantially the same shadow masking and deposition techniques as those used to fabricate blue emitting LED 55. LED 65 comprises HTL 62, green emission layer 64 and ETL 66. A second thin (<100 Å thick, thin enough to be semi-transparent but not so thin to lose electrical continuity) metal layer 60M is deposited on ETL layer 66, followed by another 1000–4000 Å thick ITO layer 60I to form a second sandwich layer 60.

Figure 12D:
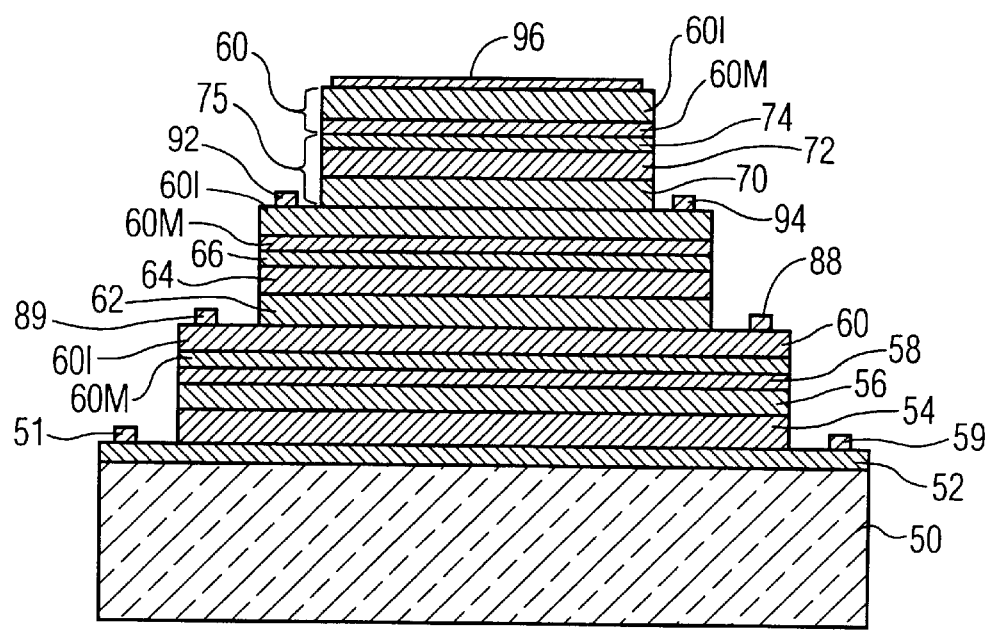
Figure 12E:
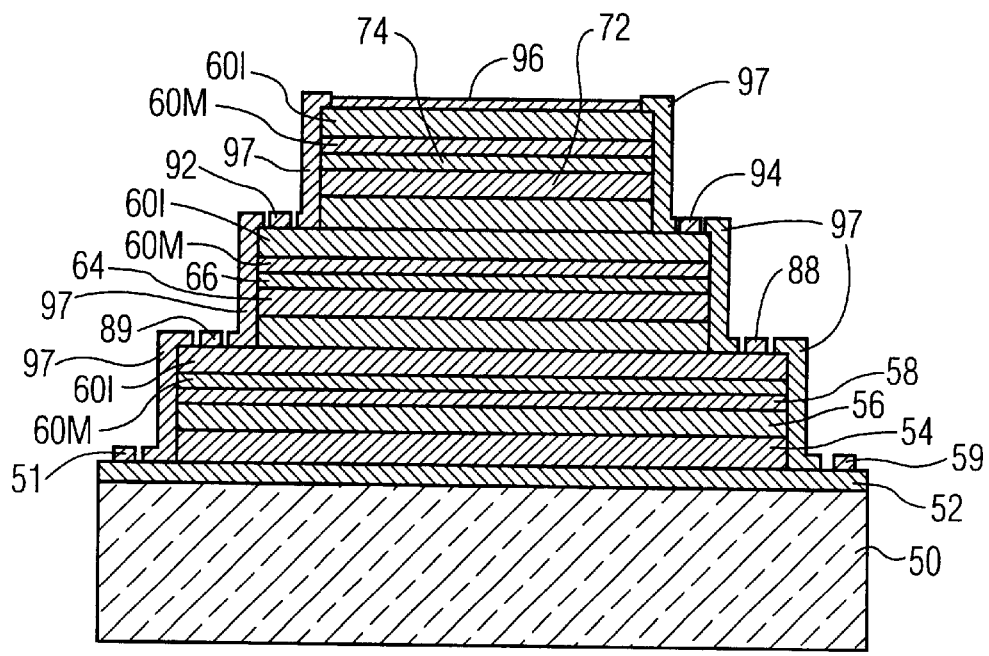

Shown in FIG. 12D is a red emitting LED 75 fabricated upon layer 60 (upon 60I to be specific) using similar shadow masking and metal deposition methods. Red emitting LED 75 consists of a HTL 70, a red emitting EL 72 and ETL 74. A top sandwich layer 60 of layers 60I and 60M are then formed on LED 75. As described above for the embodiment of FIG. 2, similarly, the top transparent ITO layer 60I can in an alternative embodiment be replaced by an appropriate metal electrode serving also to function as a mirror for reflecting upwardly directed light back through the substrate 50, thereby decreasing light losses out of the top of the device. Each ETL layer 74, 66 and 58 has a thickness of 50–200 Å; each HTL layer 54, 62 and 70 is 100–500 Å thick; and each EL layer 56, 64 and 72 is 50–1000 Å thick. For optimum brightness and efficiency, each of the layers including the ITO/metal layers should be kept as close as possible towards the lower end of the above ranges.

The formation of electrical contacts 51 and 59 on ITO layer 52, and electrical contacts 88, 89, 92, 94 and 96 on the ITO portion 60I of ITO/metal layers 60 is then preferably accomplished in one step. These electrical contacts may be indium, platinum, gold, silver or combinations such as Ti/Pt/Au, Cr/Au or Mg/Ag. They may be deposited by vapor deposition or other suitable metal deposition techniques after masking off the rest of the device.

The final step in the shadow masking process is to overcoat the entire device with an insulating layer 97 as shown in FIG. 12E, with the exception of all the metal contacts 51, 59, 88, 89, 92, 94 and 96 which are masked. Insulating layer 97 is impervious to moisture, oxygen and other contaminants thereby preventing contamination of the LED's. Insulating layer 97 may be $SiO_2$, a silicon nitride such as $Si_2N_3$ or other insulator deposited by electron-beam, sputtering, or pyrolitically enhanced or plasma enhanced CVD. The deposition technique used should not elevate the device temperature above 120° C. inasmuch as these high temperatures may degrade the LED characteristics.

The dry etching process for fabricating the LED stack according to the invention is illustrated in FIGS. 13(A–F). Referring to FIG. 13A, a glass substrate 102 is first cleaned in the same manner as in the shadow-mask process described above. An ITO layer 101 is then deposited on the glass substrate 102 in a vacuum using conventional sputtering or electron beam methods. An HTL 104, blue EL 105, ETL 106 and sandwich layer comprising metal layer 107M and ITO layer 107I, all of generally the same thicknesses as in the shadow-masking process, are then deposited over the full surface of the ITO layer 101, using either conventional vacuum deposition, or in the case of polymers spin or spray coating techniques. ITO/metal sandwich layer 107 consists of a less than 100 Å thick, low work function metal layer 107M deposited directly on the ETL layer 106, and a 1000–4000 Å thick ITO layer 107I on the metal layer 107M. On the entire top surface of ITO layer 107I, a 1000 Å–2000 Å thick layer of silicon nitride or silicon dioxide masking material 108 is deposited using low temperature plasma CVD. A positive photoresist layer 109 such as HPR 1400 J is then spun-on the silicon nitride layer 108. As shown in FIG. 13B the outer portions 110 (see FIG. 13A) of the photoresist layer 109 are exposed and removed using standard photolithographic processes. The exposed outer portions 110 correspond to the areas where the bottom ITO layer 101 is to be exposed and electrically contacted. Referring to FIG. 13C, the outer regions 111 (defined in FIG. 13B) of the silicon nitride layer 108 corresponding to the removed photoresist areas, are removed using a $CF_4:O_2$ plasma. Then, using an ion milling technique or another plasma etch, the exposed outer portions of ITO/metal layers 107I and 107M are removed. An $O_2$ plasma is then employed to sequentially remove the corresponding exposed outer portion of the ETL layer 106, EL layer 105, and HTL layer 104, respectively, and also to remove the remaining photoresist layer 109 shown in FIG. 13D. Finally, a $CF_4:O_2$ plasma is again applied to remove the silicon nitride mask 108, with the resulting blue LED configuration shown in FIG. 13D.

Figure 13A:
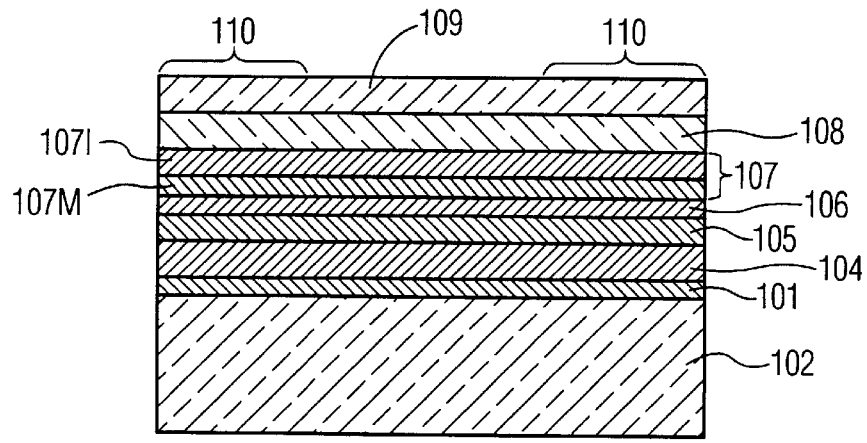
FIGS. 13(A–F) illustrate a dry etching process for the fabrication of the multicolor LED according to the invention.
Figure 13B:
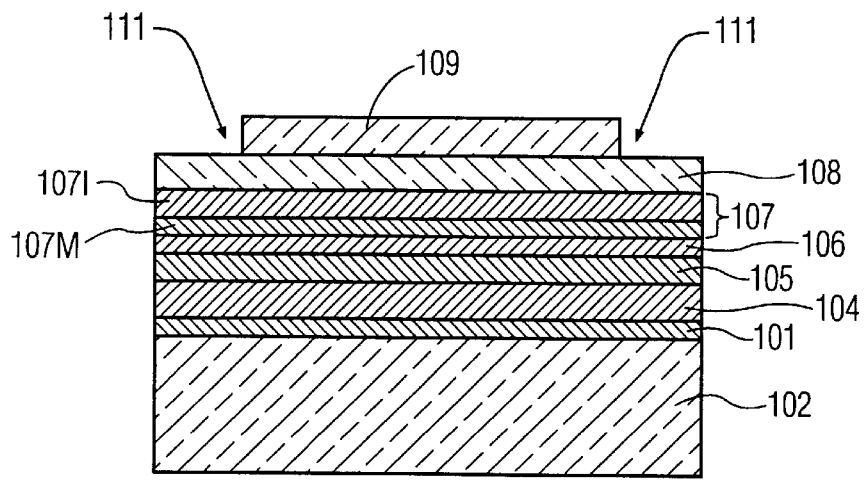
Figure 13C:
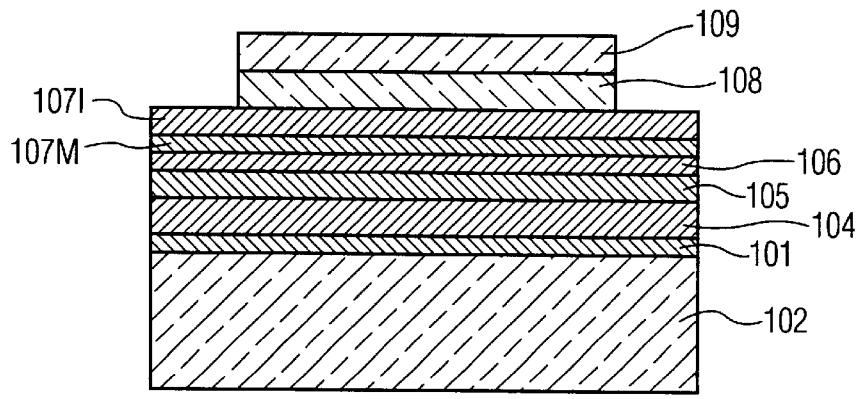
Figure 13D:
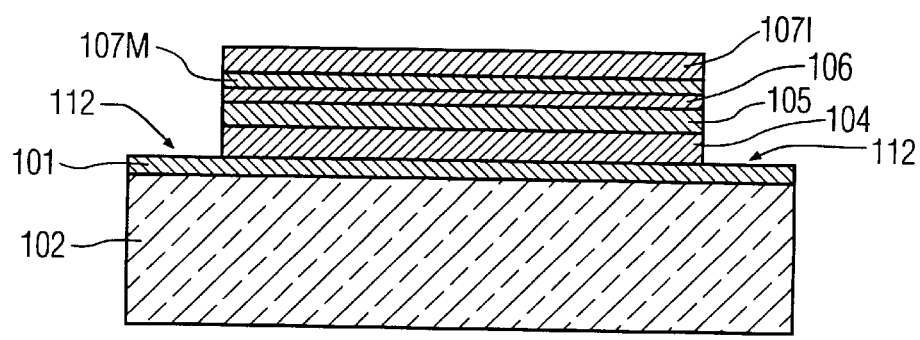
Figure 13E:
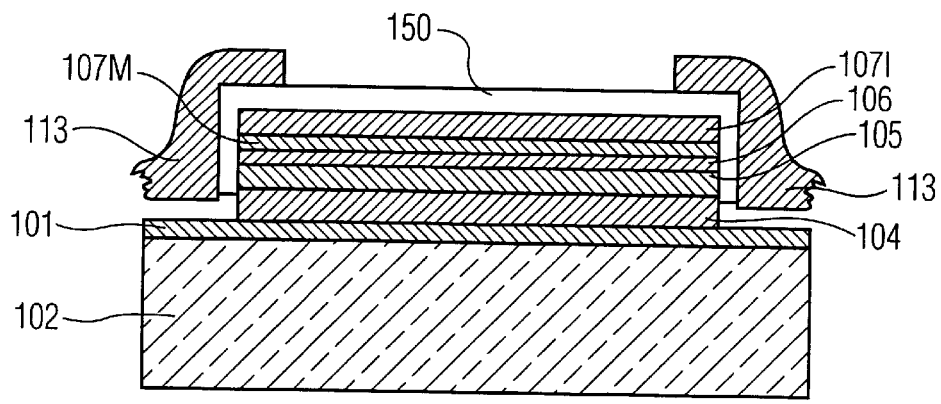

The same sequence of dry etching process steps is used to fabricate a green LED 115 atop the blue LED, except that SiNx 150 is overlaid as shown, followed by a photoresist mask 113 as shown in FIG. 13E to mask the outer portion of ITO layer 101. Then the deposition of HTL layer 114, green EL layer 116, and so on is performed (see FIG. 13F). The same photolithography and etching techniques used for blue LED fabrication are then employed to complete the formation of the green LED 115. The red LED 117 is then formed atop the green LED using substantially the same dry etching process. A passivation layer 119 similar to layer 97 of FIG. 12E is then deposited over the LED stack with suitable patterning to expose electrical contacts, as was described for the shadow masking process. A photoresist mask is used to allow dry etching of holes in passivation layer 119. Next, metal 152 is deposited in the holes. A final photoresist layer and excess metal is removed by a "lift-off" process.

Figure 13F:
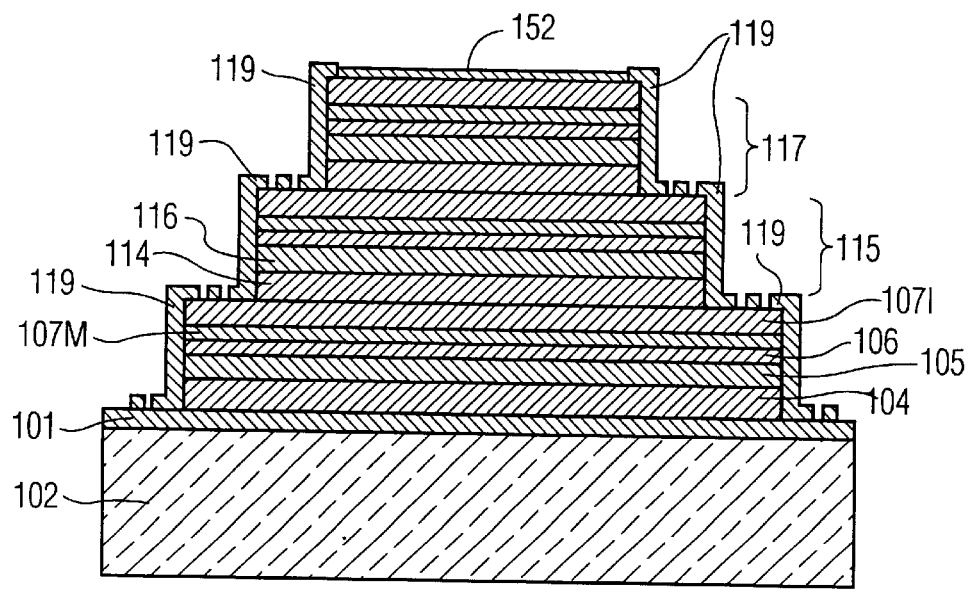
Figure 14A:
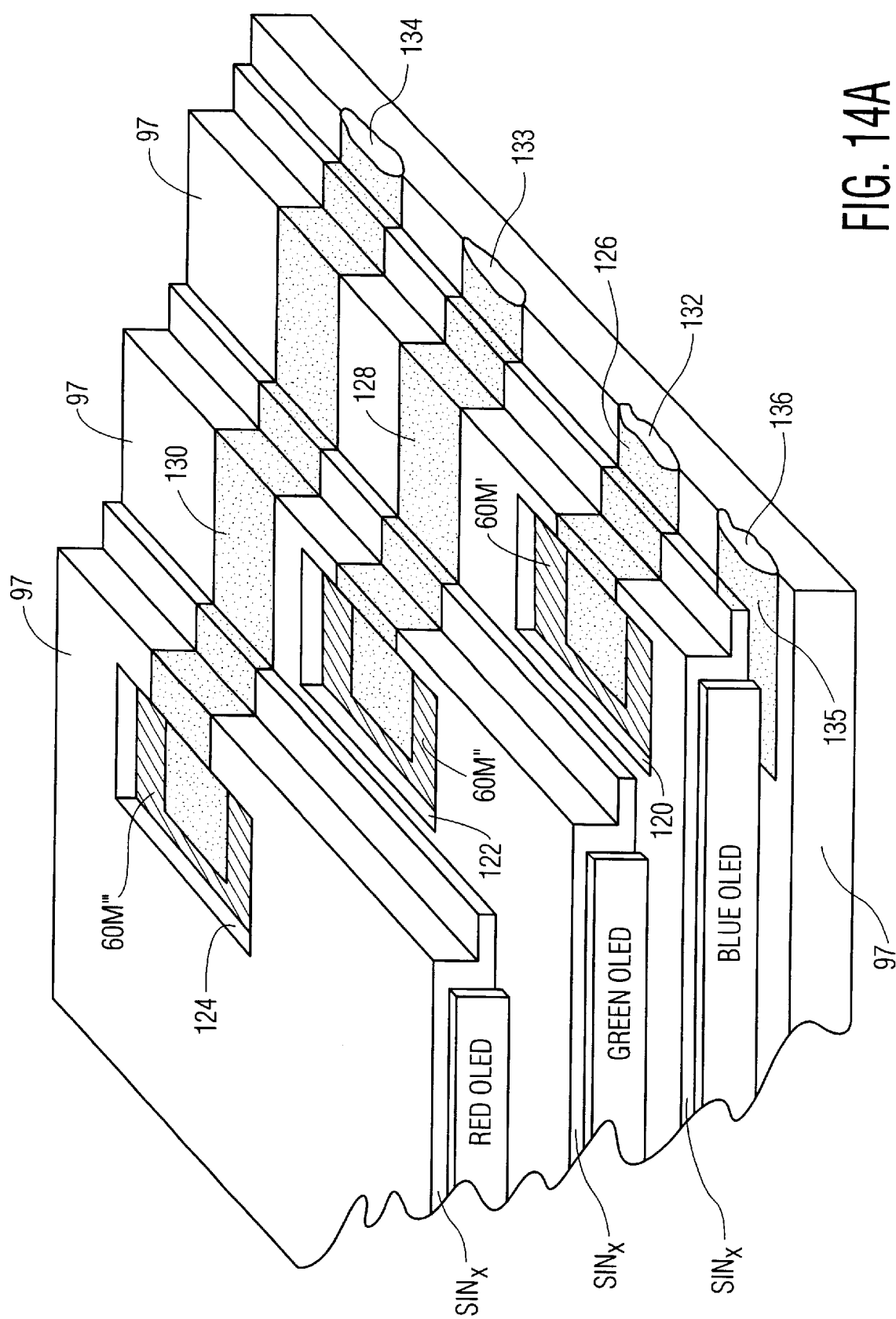
FIG. 14A shows a multicolor LED of one embodiment of this invention configured for facilitating packaging thereof.

Following the LED stack fabrication, whether performed by a shadow mask, dry-etching or other method, the stack must be properly packaged to achieve acceptable device performance and reliability. FIGS. 14(A–C) illustrate embodiments of the invention for facilitating packaging, and for providing a hermetic package for up to four of the multicolor LED devices of the invention, for example. The same reference numerals used in FIGS. 14(A–B) indicate the identical respective features as in FIG. 12E. The package may also be used with the nearly identical structure of FIG. 13F. Referring to FIG. 14A, after overcoating the entire device with an insulating layer 97, such as SiNx for example, access holes 120, 122, and 124 are formed using known etching/photomasking techniques to expose the topmost metal layers 60M', 60M", and 60M''', for the blue, green, and red LED (organic light emitting diode) devices, respectively, in this example. Thereafter, suitable metal circuit paths 126, 128, and 130 (typically of gold material), are deposited in a path from the exposed metal layers 60M', 60M", and 60M''', respectively, to edge located indium solder bumps 132, 133, and 134, respectively, using conventional processing steps. Similarly, an anode electrode termination is provided via the metal (Au, for example) circuit path 135 formed to have an inner end contacting ITO layer 52, and an outer end terminating at an edge located indium solder bump 136, all provided via conventional processing. The device is then overcoated with additional insulating material such as SiNx to form an insulated covering with solder bumps 132, 133, 134, and 136 being exposed along one edge. In this manner, the organic LED device can be readily packaged using conventional techniques, or the packaging embodiment of the invention as described immediately below.

Figure 14B:
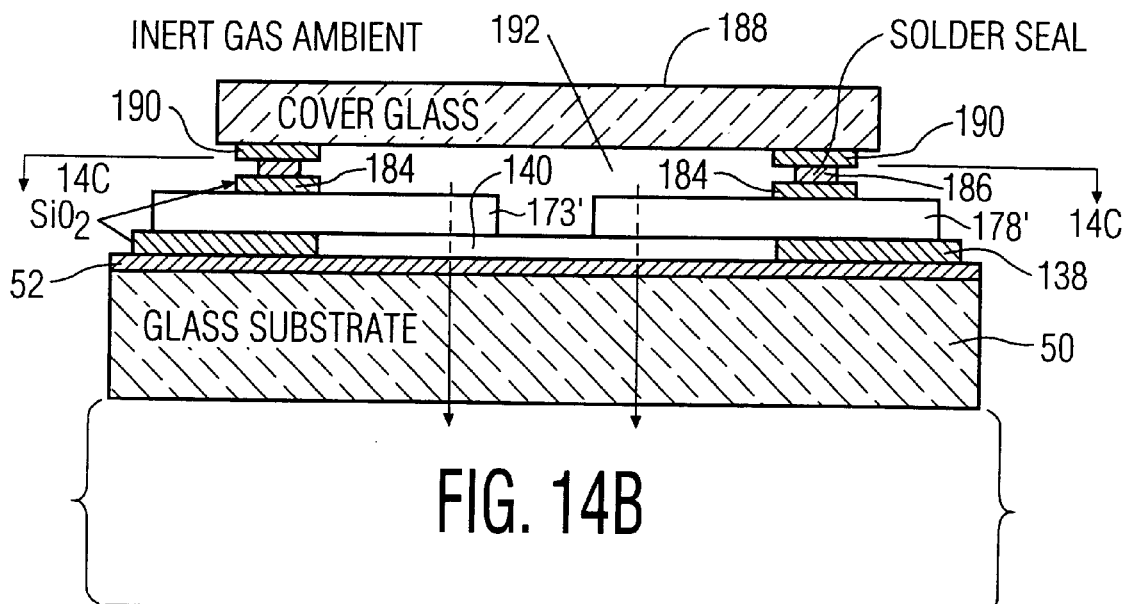
FIG. 14B shows a cross sectional view of a hermetic package for another embodiment of the invention.
Figure 14C:
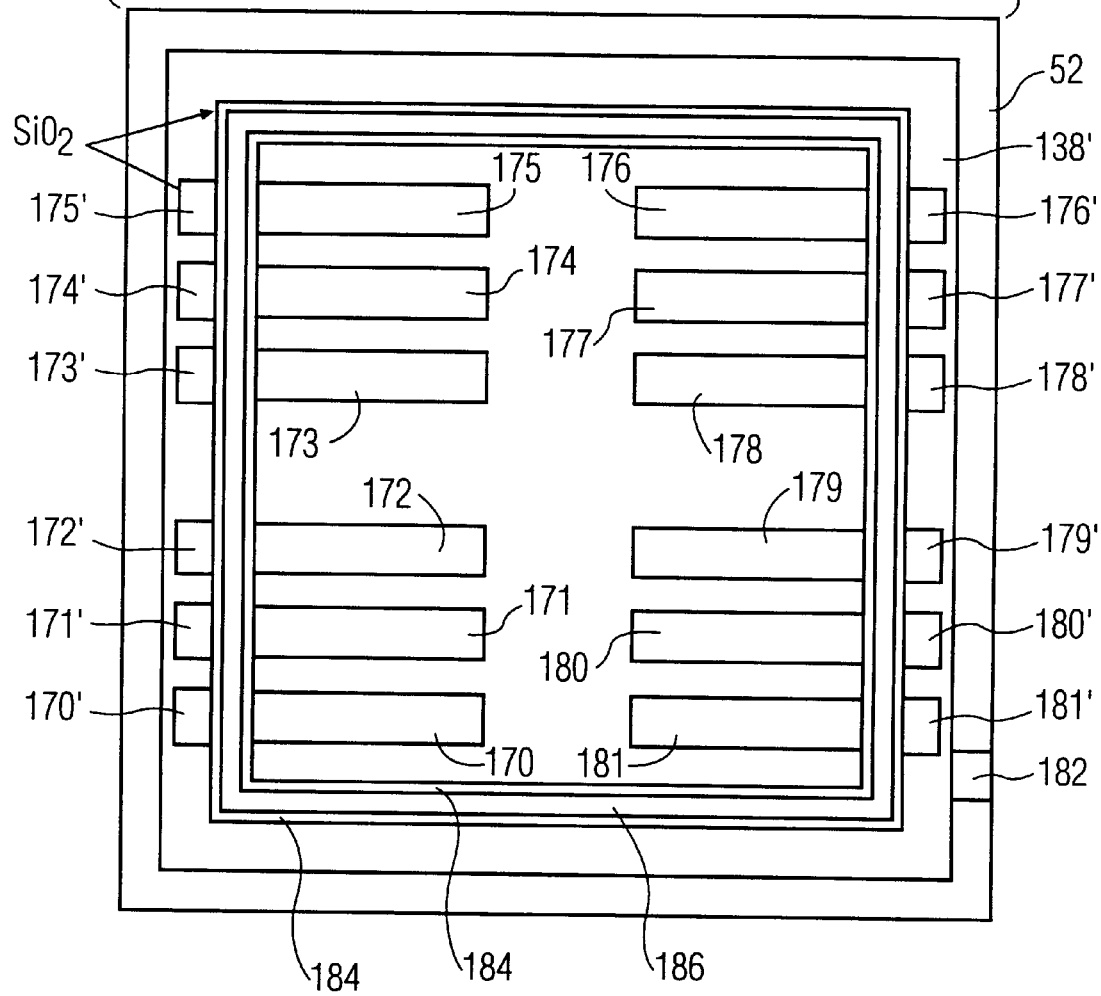
FIG. 14C is cross sectional view taken along line 14C–14C of FIG. 14B.

A method for making four multicolor LED devices on a common substrate 50 in a packaged configuration will now be described, with reference to FIGS. 14A, 14B, and 14C, respectively, for another embodiment of the invention. The starting material includes a glass substrate 50 coated with an overlayer of indium tin oxide (ITO) 52. The following steps are used to obtain the packaged multicolor organic LED array:

1. Mask ITO layer 52 to deposit an $SiO_2$ layer 138 in a concentric square band ring pattern, in this example (some other pattern can be employed), on top of ITO layer 52 using conventional techniques.

2. Form four three-color LED stacks sharing common layers in region 140 on the ITO layer 52 using methods as taught above for obtaining, for example, either of the structures of FIGS. 12E or 13F, and 14A.

3. Deposit via shadow masking metal contacts 170 through 181; each terminating at exterior ends on $SiO_2$ Layer 138, for providing external electrical connecting or bonding pads 170' through 181', respectively. Note that contacts 126, 128, and 130 in FIG. 14A are the same as every successive three of contacts 170–181, respectively. Each group of three contacts, namely 170 through 172, 173 through 175, 176 through 178, and 179 through 181, terminate at their interior or other ends to provide an electrical connection with the metal layers 60M', 60M", 60M''', respectively, of each of the four organic LED devices, respectively. Another metal contact 182 is deposited via shadow masking on an edge of ITO layer 52 common to all four of the LED devices, for providing a common anode connection, in this example. Note that if through appropriate masking and etching the four LED devices are made in completely independent layers, four anode contacts, respectively, will have to be provided for the latter array so that it can be operated in a multiplexed manner. The multicolor LED array being described in this example is a non-multiplexed array.

4. Deposit via shadow masking, for example, a second $SiO_2$ layer 184 in a continuous band or ring leaving exposed bonding pads 170' through 181', using either sputtering, or plasma enhanced CVD, or electron beam deposition, for example.

5. Deposit Pb—Sn or other low temperature melting solder in a continuous band or ring 186 on top of the second $SiO_2$ layer or band 184.

6. Deposit on the bottom of a cover glass 188 a metal ring 190 to be coincident with the solder seal ring 186.

7. Place the assembly in an inert gas atmosphere, such as dry nitrogen, and apply heat to melt solder ring 186 to obtain an air tight seal, with the inert gas trapped in interior region 192.

8. Install cover glass 188 over the assembly, as shown in FIG. 14B, with metal ring 190 abutting against the solder ring 186.

Figure 15:
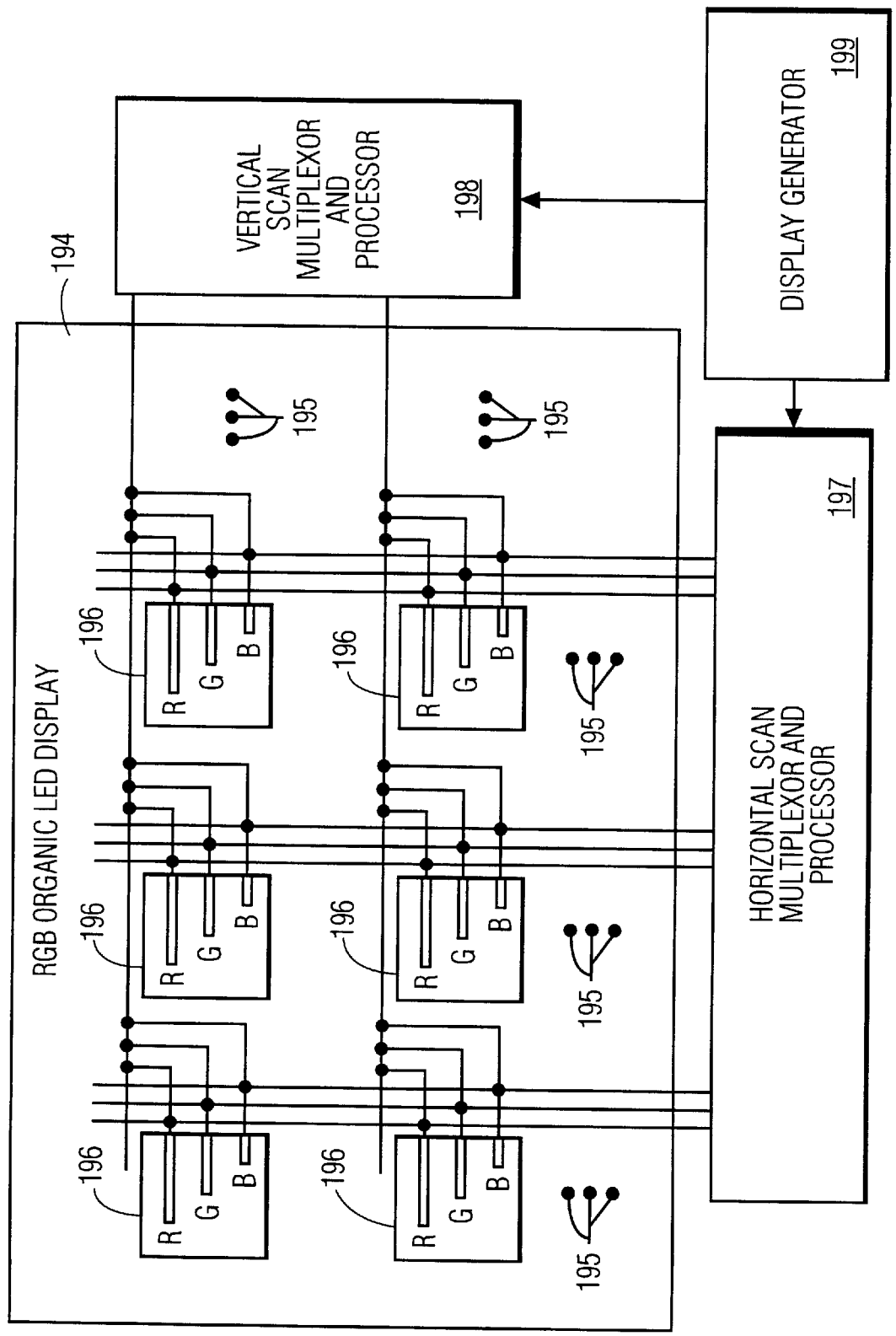
FIG. 15 is a block diagram showing an RGB display utilizing LED devices according to this invention together with display drive circuitry.

Referring to FIG. 15, there is shown a display 194 which is an RGB organic LED display. The dots 195 are ellipsis. A complete display as 194 comprises a plurality of pixels such as 196. The pixels are arranged as a XY matrix to cover the entire surface area of a glass sheet coated with ITO. Each pixel includes a stacked LED structure as that shown in FIG. 2. Instead of having fixed bias means as batteries 30, 31 and 32 (FIG. 2) each of the lines of terminals designated in FIG. 2 as blue (B), green (G) and red (R) are brought out and coupled to suitable horizontal and vertical scan processors 197 and 198, respectively, all under control of a display generator 199 which may be a TV unit. Accordingly, each matrix of LED's has at least two axes (x,y), and each LED is at the intersection of at least two of the axes. Also, the x-axis may represent a horizontal axis, and the y-axis a vertical axis. It is well known how to convert television signals such as the NTSC signals into the color components R, G and B for color displays. Monitors for computers which utilize red, green and blue for primary colors are also well known. The drive and control of such devices by vertical and horizontal scanning techniques are also known. The entire array of pixel structures deposited over the surface of the display is scanned employing typical XY scanning techniques as using XY addressing. These techniques are used in active matrix displays.

One can use pulse width modulation to selectively energize the red, green and blue inputs of each of the DH LED pixels according to desired signal content. In this manner, each of the LED's in each line of the display are selectively accessed and addressed and are biased by many means such as by pulse width modulation signals or by staircase generated voltages to enable these devices to emit single colors or multiple colors, so that light emitted from said structures creates an image having a predetermined shape and color. Also, one can serially scan each of the xy axes, and serially energize selected ones of the LED's in the matrix to emit light for producing an image with colors created serially vertically. Selected ones of the LED's may be simultaneously energized.

As indicated above, the vertical layering technique shown in FIG. 2 allows the fabrication of the three color DH LED pixel within extremely small areas. This allows one to provide high definition displays such as displays that have 300 to 600 lines per inch resolution or greater. Such high resolution would not be obtainable using prior art techniques in which the organic emission layers or fluorescent mediums generating the different colors are laterally spaced from one another.

Based on modern standards one can provide a LED device as shown in FIG. 2 with an effective area small enough to enable hundreds of pixel diodes to be stacked vertically and horizontally within the area of a square inch. Therefore, the fabrication techniques enables one to achieve extremely high resolution with high light intensity.

Figure 16:
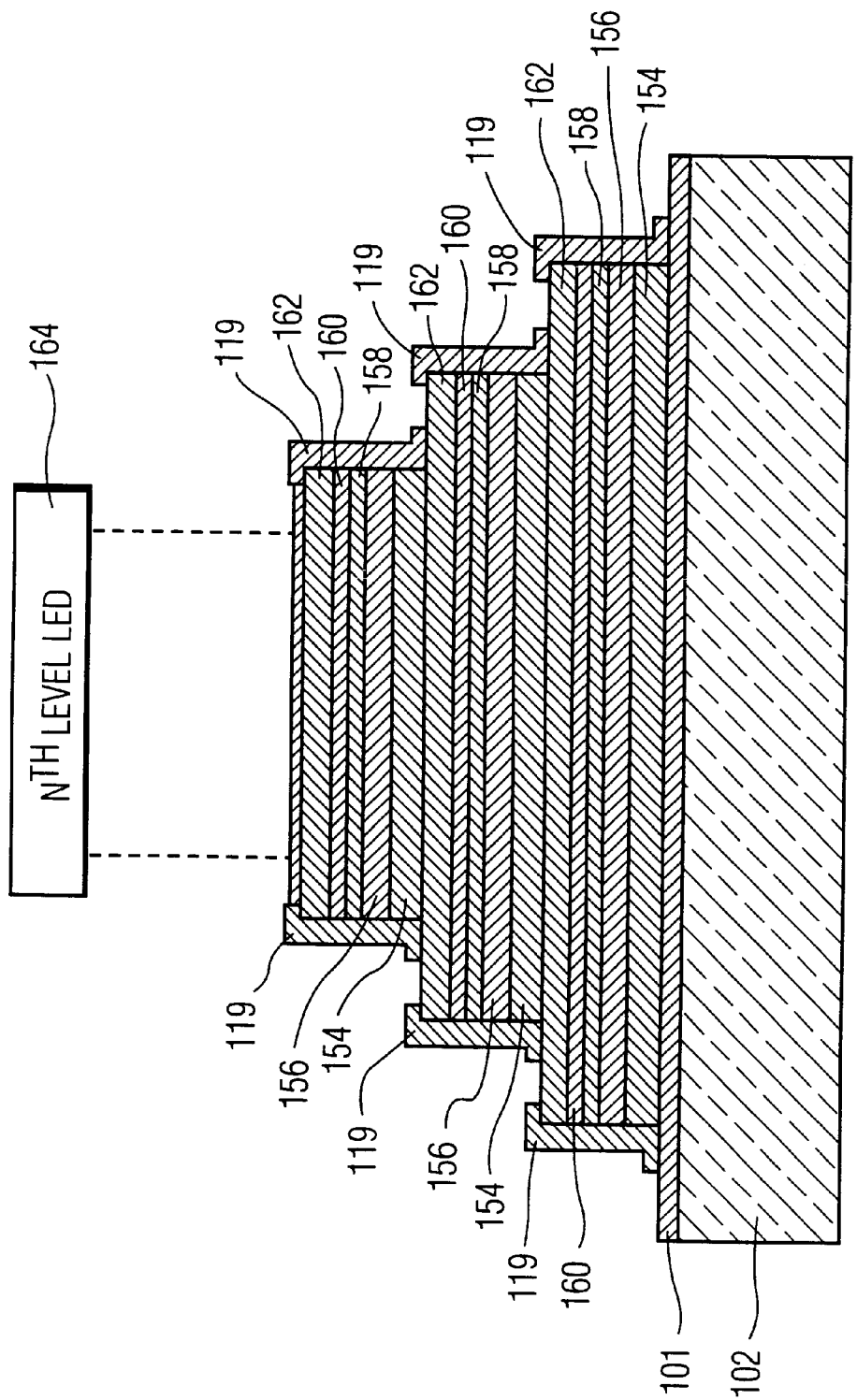
FIG. 16 shows an LED device of another embodiment of the invention extending the number of stacked LED's to N, where N is an integer number 1, 2, 3 . . . N.

In FIG. 16, another embodiment of the invention is shown for a multicolor LED device including the stacking of up to N individual LEDs, where N is an integer number 1,2,3 . . . N. Depending upon the state of the technology at any future time, N will have a practical limit. The stacked N levels of LEDs can, for example, be provided using either the shadow masking process steps previously described for FIGS. 12(A–E), or the dry etching process illustrated in FIGS. 13A through 13F. The base or bottom portion of the stacked array of FIG. 16 is a glass substrate 102 as shown in FIG. 13F, for example, with an ITO layer 101 formed over substrate 102. The immediately overlying first LED device, and following LED devices in this example, each include in succession over ITO layer 101 an HTL layer 154, an EL layer 156, an ETL layer 158, a metal layer 160, and an ITO layer 162. The $N^{th}$ level LED device 164 further includes a topmost metal layer (see layer 152 of FIG. 13F) formed over the uppermost ITO layer 162 thereof. A passivation layer 119 is deposited over the stack, as in the color stack of FIG. 13F. The material for each EL layer 156 of each LED device is selected for providing a particular color for the associated LED. As in the three color device, shorter wavelength (blue) devices must lie lower in the stack than the longer wavelength (red) devices to avoid optical absorption by the red emitting layers. The color selected for each respective LED and the actual number of stacked LEDs are dependent upon the particular application, and the desired colors and shading capability to be provided. Such multi-color devices can also be used in optical communications networks, where each different optical channel is transmitted using a different wavelength emitted from a given device in the stack. The inherently concentric nature of the emitted light allows for coupling of several wavelengths into a single optical transmission fiber. In practical such stacked arrays, access holes are formed down to the ITO layer 162 of each device followed by the deposition of appropriate metallization for facilitating packaging and electrical connection to each of the LED devices in the stack, in a manner similar to that described for the stacked multicolor LED device of FIGS. 14A, 14B, and 14C, for example.

This device can be used to provide a low cost, high resolution, high brightness full color, flat panel display of any size. This widens the scope of this invention to displays as small as a few millimeters to the size of a building, but to a practical limit. The images created on the display could be text or illustrations in full color, in any resolution depending on the size of the individual LED's.

Those with skill in the art may recognize various modifications to the embodiments of the invention described and illustrated herein. Such modifications are meant to be covered by the spirit and scope of the appended claims. For example, a multicolor stacked LED device, such as the above-described three color device of FIG. 2, in another embodiment of the invention can be provided by forming LED 20 from a polymer device as shown in FIG. 1C, or from a deposited metal phosphonate film, rather than having all three layers laid down in vacuo. The two remaining stacked LED's would be formed by vapor deposition.

EXAMPLE 1

Preparation of Bis(8-hydroxyquinaldine)gallium-2,
2-dimethyl-propionate

A compound shown in FIG. 3D wherein M=gallium, L=OOCC(CH$_3$)$_3$, the leftmost R=CH$_3$ and each remaining R=hydrogen was prepared in the following manner. All reactions were conducted at room temperature unless otherwise noted.

A solution of 2.0 g (7.82 mmol) of Ga(NO$_3$)$_3$·xH$_2$O in 200 mL of water was stirred rapidly with warming, while a solution of 2.452 g (15.4 mmol) of 8-hydroxyquinaldine and 7.99 g (78.2 mmol) of 2,2-dimethylpropionic acid in 600 mL of water was added over one hour. A precipitate formed immediately, and stirring was continued for an additional hour after all of the reactants had been added. The precipitate was filtered, washed with hot water, air dried, and recrystallized from methanol to yield 1.0 g of product. Absorption spectrum: $\lambda_{max}$=366 nm. Luminescence: $\lambda_{max}$=500 nm.

EXAMPLE 2

Preparation of Bis(8-hydroxyquinaldine)gallium-
benzoate(dimethyl propionate)

A compound shown in FIG. 3D wherein M=gallium, L=OOCC$_6$H$_5$, with the same R groups as described for the compound in Example 1 was prepared in the following manner. All reactions were conducted at room temperature unless otherwise indicated.

A solution of 1.0 g (3.9 mmol) of Ga(NO$_3$)$_3$·xH$_2$O in 50 mL of water was stirred rapidly while a solution of 1.226 g (7.7 mmol) of 8-hydroxyquinaldine and 6.185 g (38.6 mmol) of potassium benzoate in 280 mL of ethanol/water (50:50) was added over 30 minutes. Precipitation of the product occurred immediately, and the reaction mixture was stirred for an additional 30 minutes after all the reactants had been added. The precipitate was filtered, washed with ethanol, air dried and recrystallized from chlorobenzene to yield 1.98 g of product. Absorption spectrum: $\lambda_{max}$=366 nm. Luminescence: $\lambda_{max}$=500 nm.

EXAMPLE 3

Synthesis of 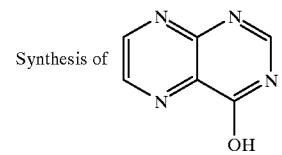

Synthesis of the above ligand (hereinafter referred to as Q$_{N4}$) occurred in the following manner. 0.955 g of 4,5-diamino-6-hydroxypyrimidine (DHP) and 30 mL of 2M acetic acid were mixed in a beaker. 12.5 mL of 4M sodium acetate was added to the beaker and the beaker was heated to 70° C. 1.5 mL of glyoxal solution (40% in water) was diluted with 10 mL of water, heated to 70° C. and added to the solution of DHP. The mixture was stirred at 70° C. for one hour and then cooled to 10° C. to give a tan colored solid. The solid was isolated by filtration, washed with methanol and dried to give 0.750 g of the ligand Q$_{N4}$.

EXAMPLE 4

Synthesis of 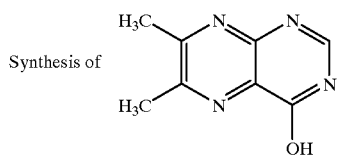

Synthesis of the above ligand (hereinafter $Q_{N4Me2}$) occurred in the following manner. 1.00 of 4,5-diamino-6-hydroxypyrimidine (DHP) and 30 mL of 2M acetic acid were mixed in a beaker. 6.8 g of sodium acetate was added to the beaker and the beaker was heated to 70° C. 0.70 mL of 2,3-butandione was diluted with 9 mL of water, heated to 70° C. and added to the solution of DHP. The mixture was stirred at 70° C. for one hour and then cooled to give a tan colored solid. The solid was isolated by filtration, washed with ethanol and dried to give 0.650 g of the ligand $Q_{N4Me2}$.

EXAMPLE 5

Synthesis of Ga-tris(1-hydroxyphenazine)

Figure 4I:
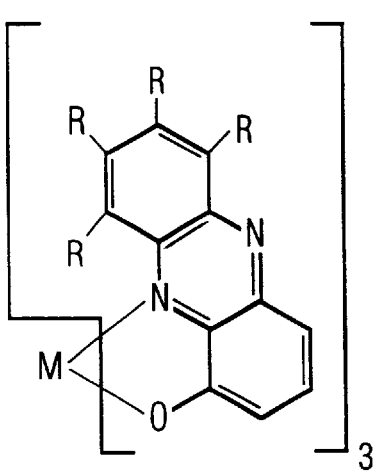
Figure 4J:
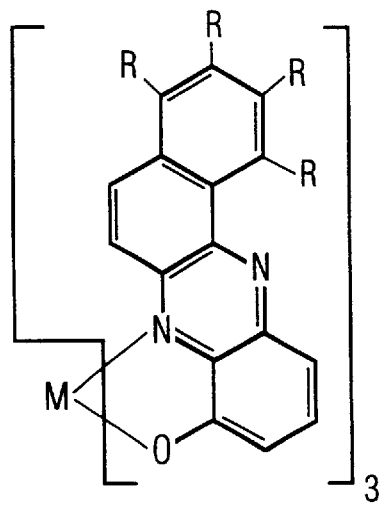

Ga-tris(1-hydroxyphenazine), the compound shown in FIG. 4I was prepared in the following manner. 0.100 g of 1-hydroxyphenazine, prepared as disclosed in G. M. Bedger *J. Chem. Soc* (1951) 3204, was combined with 20 mL of 40% aqueous ethanol. 0.04 g of $Ga(NO_3)_3$ in 5 mL of water was added and the mixture was stirred for 30 minutes. The resulting solution was neutralized with a neutralizing amount of sodium carbonate, cooled to 5° C. and filtered. The filtrate was washed with water and dried under vacuum to yield 0.06 g of Ga(1-hydroxyphenazine). Absorption spectrum: $\lambda_{max}$=360, 380, 500 nm. Luminescence: $\lambda_{max}$=680 nm.

EXAMPLE 6

Synthesis of bis(triphenylsiloxane) (1-hydroxyphenazine)aluminum 0.32 g of aluminumtrisisopropoxide, 0.30 g of 1-hydroxyphenazine (prepared as described in Example 5) and 10 mL of dry toluene were mixed in a flask in an argon atmosphere. The mixture was stirred for 1.5 hours followed by the addition of 0.860 g of triphenylsilanol. The mixture was stirred for one additional hour and all of the volatiles were removed in vacuo. The resulting solid was recrystallized from dichloromethane to yield 0.76 g of the product disclosed in FIG. 3J. Absorption spectrum: $\lambda_{max}$=370, 355, 420 nm. Luminescence: $\lambda_{max}$=between 500 and 660 nm.

EXAMPLE 7

Figure 4K:
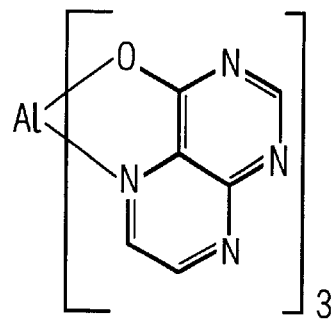

Synthesis of $Al(Q_{N4})_3$ 1.00 g of the sodium salt of $QN_4$, the composition and synthesis of which is described in Example 3, was dissolved in 10 mL of water. 0.735 g of $Al(NO_3)_3 \cdot 9H_2O$ in 10 mL of water was added to the $QN_4$ solution and the mixture was stirred for one hour. The product $Al(Q_{N4})_3$ as shown in FIG. 4K was isolated by filtration, washed with water and dried in vacuo. Absorption spectrum: $\lambda_{max}$=270, 310 nm. Luminescence: $\lambda_{max}$=422 nm.

EXAMPLE 8

Figure 4L:
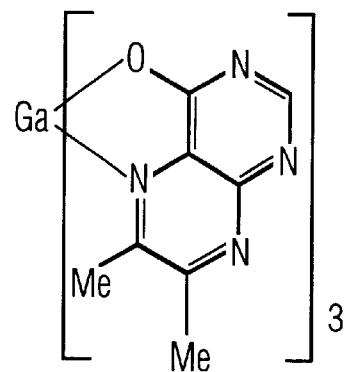

Synthesis of $Ga(Q_{N4Me2})_3$ 1.00 g of the sodium salt of $Q_{N4Me2}$, the composition and synthesis of which is described in Example 4, was dissolved in 20 mL of water. 0.43 g of $Ga(NO_3)_3 \cdot xH_2O$ in 5 mL of water was added to the $Q_{N4Me2}$ solution and the mixture was stirred for one hour. The product $Ga(Q_{N4Me2})_3$ as shown in FIG. 4L was isolated by filtration, washed with water and dried in vacuo. Absorption spectrum: $\lambda_{max}$=295 nm. Luminescence: $\lambda_{max}$=345 nm.

EXAMPLE 9

Figure 4M:
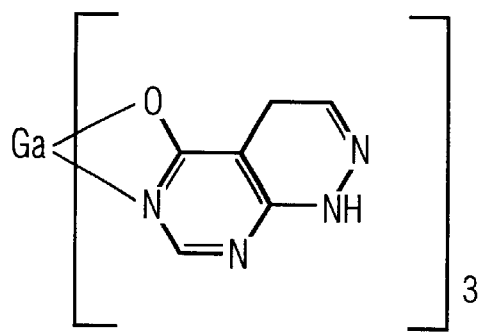

Synthesis of the Compound Shown in FIG. 4M 0.113 g of sodium hydroxide was dissolved in 2.5 mL of water. 0.25 g of 4-hydroxypyrazol[3,4-d]-pyrimidine was then added to the solution. The resulting solution was then added to 0.114 g of $Ga(NO_3)_3 \cdot xH_2O$ in 15 mL of water. The mixture was stirred for one hour. The resulting product was then isolated by filtration, washed with ethanol and dried in vacuo. Absorption spectrum: $\lambda_{max}$=280 nm. Luminescence: $\lambda_{max}$=390 nm.

What is claimed is:

1. A multicolor light emitting device (LED) structure, comprising:

a plurality of at least a first and a second light emitting organic device (LED) stacked one upon the other, to form a layered structure, with each LED separated one from the other by a transparent conductive layer to enable each device to receive a separate bias potential to emit light through the stack, at least one of said LED's comprising an emission layer, said emission layer comprising at least one of a) a trivalent metal complex having the formula:

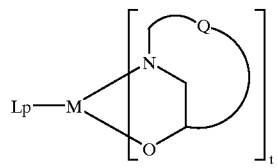

wherein M is a trivalent metal ion; Q are the atoms necessary to make at least one fused ring, at least one of said fused rings containing at least one nitrogen atom; L is a ligand selected from the group consisting of picolylmethylketone; substituted and unsubstituted salicylaldehyde; a group of the formula $R^1(O)CO$— wherein $R^1$ is selected from the group consisting of hydrogen, an alkyl group, an aryl group, and a heterocyclic group, each of which may be substituted with at least one substituent selected from the group consisting aryl, halogen, cyano and alkoxy; halogen; a group of the formula $R^1O$— wherein $R^1$ is as defined above, bistriphenyl siloxides and quinolates and derivatives thereof; p is 1 or 2 and t is 1 or 2 wherein p does not equal t; and b) a trivalent metal bridged complex having the formula:

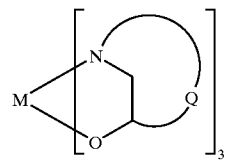

wherein M and Q are defined as above.

2. The multicolor LED structure of claim 1 wherein M is selected from the group consisting of $Al^{+3}$ $Ga^{+3}$ and $In^{+3}$.

3. The multicolor LED structure of claim 1 wherein L is selected from the group consisting of chloro, methyl carboxylate, salicylaldehyde substituted with barbituric acid, 8-hydroxyquinoline substituted with barbituric acid, and quinolate.

4. The multicolor LED structure of claim 1 wherein the emission layer further comprises a matrix formed from at least one host compound capable of carrying electrons to the emitting compound.

5. The multicolor LED structure of claim 4 wherein the host compound is selected from the group consisting of bis substituted borate complexes, tris substituted borate complexes and combinations thereof.

6. The multicolor LED structure of claim 4 wherein the host compound is selected from the group consisting of compounds of the following formulas:

a)
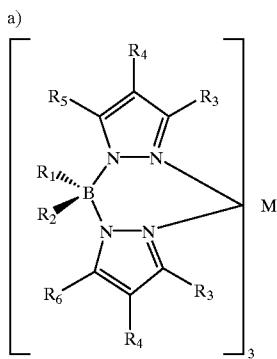

b)
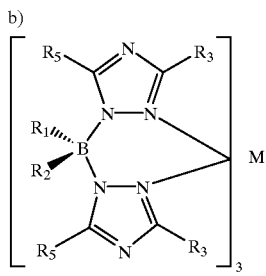

c)
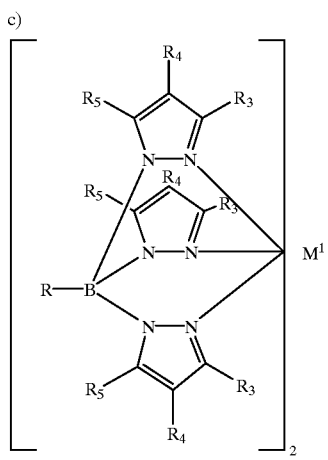

d)
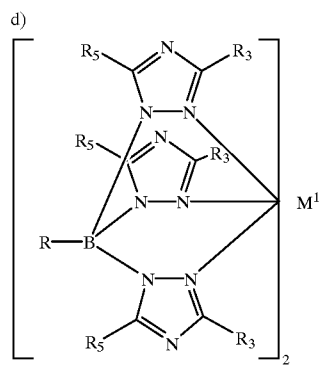

wherein M for compounds represented by formulas (a) and (b) is a +3 metal while $M^1$ for compounds represented by formulas (c) and (d) is a +2 metal; and $R_1$ through $R_5$ are independently selected from the group consisting of hydrogen, an alkyl group and an aryl group.

7. The multicolor LED structure of claim 6 wherein the +3 metal is a Group 13 metal and the +2 metal is a Group 12 metal.

8. The multicolor LED structure of claim 6 wherein at least one of $R_1$ through $R_5$ is phenyl.

9. The multicolor LED structure of claim 4 wherein the mole % ratio of the emitting compound to the host compound is from about 0.01 to 50.0.

10. The multicolor LED structure of claim 1, wherein Q comprises at least two fused rings, said rings being unsubstituted or substituted 5-, 6-membered rings or a combination of 5- and 6-membered unsubstituted or substituted rings.

11. The multicolor LED structure of claim 1 wherein the trivalent metal complex is selected from the group consisting of a compound of the following formulas:

1)
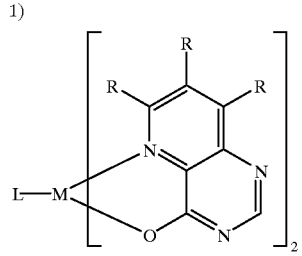

2)
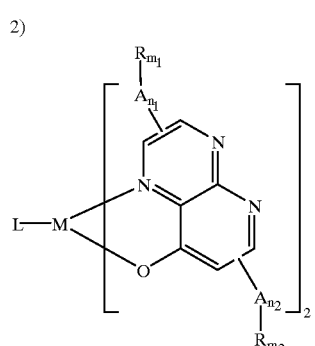

wherein R is selected from the group consisting of hydrogen, an alkyl group, an aryl group, and a heterocyclic group which may be substituted with at least one substituent selected from the group consisting of aryl, halogen, cyano and alkoxy; A is an aryl group or a nitrogen containing heterocyclic group fused to the existing fused ring structure; $n_1$ and $n_2$ are independently 0, 1 or 2 and $m_1$ and $m_2$ are independently 1, 2, 3 or 4, and b) the trivalent metal bridged complex is a compound selected from the group consisting of:

1)

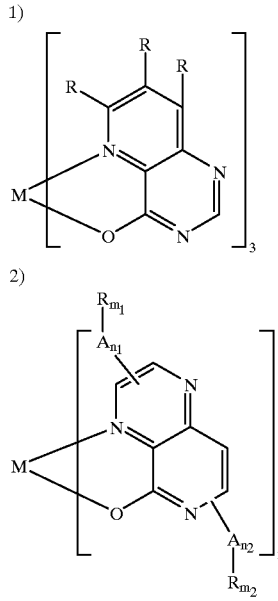

2)

wherein R, M, A, $m_1$, $m_2$, $n_1$, and $n_2$ are as defined above.

12. The multicolor LED structure of claim 11 wherein M is selected from the group consisting of $Al^{+3}$, $Ga^{+3}$ and $In^{+3}$.

13. The multicolor LED structure of claim 11 wherein R is selected from the group consisting of methyl, ethyl, phenyl, pyridyl, imidazole, furan and thiophene.

14. The multicolor LED structure of claim 11 wherein L is selected from the group consisting of chloro, methyl carboxylate, salicylaldehyde substituted with barbituric acid, 8-hydroxyquinoline substituted with barbituric acid, and quinolate.

15. The multicolor LED structure of claim 11 wherein A is selected from the group consisting of phenyl, phenyl groups fused together, substituted phenyl and substituted phenyl groups fused together.

16. The multicolor LED structure of claim 15 wherein the substituents do not quench fluorescence.

17. The multicolor LED structure of claim 16 wherein the substituents are selected from the group consisting of alkyl, alkylamino, ether linkages, cyano, and trihaloalkyl.

18. A multicolor light emitting device (LED) structure, comprising:

a plurality of at least a first and a second light emitting organic device (LED) stacked one upon the other, to form a layered structure, with each LED separated one from the other by a transparent conductive layer to enable each device to receive a separate bias potential to operate to emit light through the stack, at least one of said LED's comprising an emission layer containing an emitting compound and a matrix for the emitting compound comprising an effective amount of at least one host compound capable of carrying electrons to the emitting compound.

19. An energizable, light emitting structure, comprising:

a transparent substrate;

a first layer of substantially transparent, electrically conductive material supported on said substrate;

a transparent, energizable, light emitting device (LED) supported on said first layer of substantially transparent, electrically conductive material, said LED including an emission layer comprising at least one emitting compound in a matrix of at least one host compound capable of carrying electrons to the emitting compound;

a second layer of electrically conductive material supported by said LED; and said LED being operative to produce light and transmit it through said transparent substrate when energized.

20. The structure of claim 19, further comprising:

said second layer of electrically conductive material being substantially transparent;

a second transparent, energizable, light emitting device (LED) supported on said second layer of electrically conductive material, said second LED including an emission layer comprising at least one emitting compound in a matrix of at least one host compound capable of carrying electrons to the emitting compound;

a third layer of electrically conductive material supported by said second LED; and said second LED being operative to produce light and transmit it through said first LED and through said transparent substrate when energized.

21. The structure of claim 19, wherein said emission layer comprises at least one emitting compound selected from the group consisting of a) a trivalent metal complex having the formula:

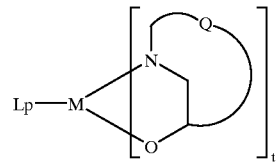

wherein M is a trivalent metal ion; Q is at least one fused ring, at least one of said fused rings containing at least one nitrogen atom; L is a ligand selected from the group consisting of picolylmethylketone; substituted and unsubstituted salicylaldehyde; a group of the formula $R^1(O)CO—$ wherein $R^1$ is selected from the group consisting of hydrogen, an alkyl group, an aryl group, and a heterocyclic group, each of which may be substituted with at least one substituent selected from the group consisting of aryl, halogen, cyano and alkoxy; halogen; a group of the formula $R^1O—$ wherein $R^1$ is as defined above; bistriphenyl siloxides; and quinolates and derivatives thereof; p is 1 or 2 and t is 1 or 2 wherein p does not equal t; and b) a trivalent metal bridged complex having the formula:

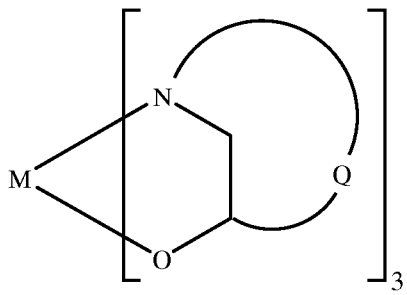

wherein M and Q are defined as above.

22. The structure of claim 19 wherein the emission layer further comprises a matrix formed from at least one host compound capable of carrying electrons to the emitting compound.

23. A multicolor, energizable, light emitting display comprising:
a plurality of energizable, light emitting structures;
each of said structures comprising a plurality of transparent, light emitting devices (LED) that are stacked on each other;
each of said LEDs in each of said structures being operative to emit a different color light when energized and including an emission layer comprising at least one emitting compound in a matrix of at least one host compound capable of carrying electrons to the emitting compound; and
means for selectively energizing at least one of said LEDs in each of said structures so that the color produced by each of said light emitting structures is determined by which LED or LEDs in each light emitting structure is energized so that light emitted from said structures creates an image having a predetermined shape and color.

24. The display of claim 23 wherein the emitting compound comprises at least one of
a) a trivalent metal complex having the formula:

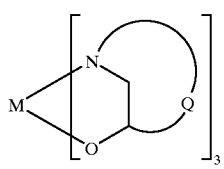

wherein M is a trivalent metal ion; Q is at least one fused ring, at least one of said fused rings containing at least one nitrogen atom; L is a ligand selected from the group consisting of picolylmethylketone; substituted and unsubstituted salicylaldehyde; a group of the formula $R^1(O)CO$— wherein $R^1$ is selected from the group consisting of hydrogen, an alkyl group, an aryl group, and a heterocyclic group, each of which may be substituted with at least one substituent selected from the group consisting aryl, halogen, cyano and alkoxy; halogen; a group of the formula $R^1O$— wherein $R^1$ is as defined above; bistriphenyl siloxides; and quinolates and derivatives thereof; p is 1 or 2 and t is 1 or 2 wherein p does not equal t; and b) a trivalent metal bridged complex having the formula:

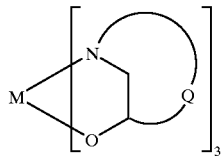

wherein M and Q are defined as above.

25. The display of claim 24 wherein the emitting compound comprises at least one of
a) a trivalent metal complex selected from the group consisting of a compound of the following formulas:

1)

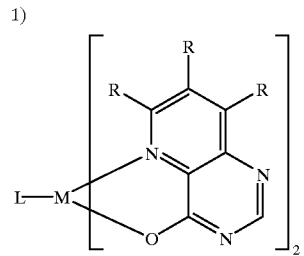

2)

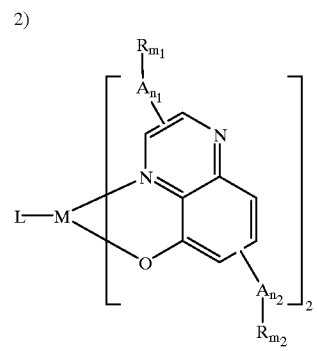

wherein R is selected from the group consisting of hydrogen, an alkyl group, an aryl group, and a heterocyclic group which may be substituted with at least one substituent selected from the group consisting of aryl, halogen, cyano and alkoxy; A is an aryl group or a nitrogen containing heterocyclic group fused to the existing fused ring structure; $n_1$ and $n_2$ are independently 0, 1 or 2 and $m_1$ and $m_2$ are independently 1, 2, 3 or 4, and b) the trivalent metal bridged complex is a compound selected from the group consisting of 1)
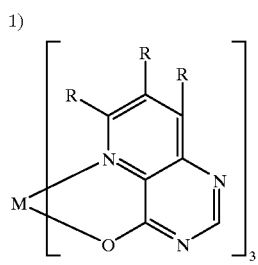

2)
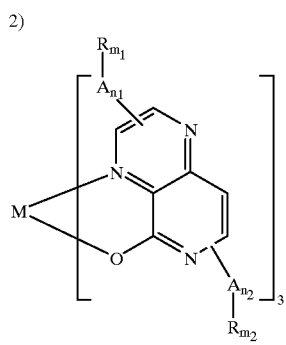

where R, M, A, $n_1$, $n_2$, $m_1$ and $m_2$ are as defined above.

26. The display of claim 23 wherein the host compound is selected from the group consisting of bis substituted borate complexes, tris substituted borate complexes and combinations thereof.

27. The display of claim 26 wherein the host compound is selected from the group consisting of compounds of the following formulas:

a)
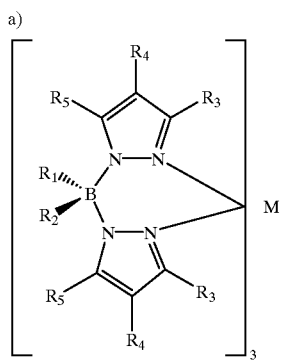

b)
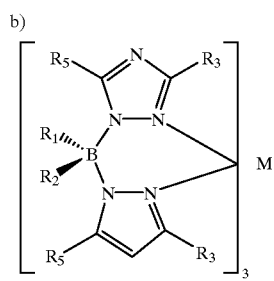

c)
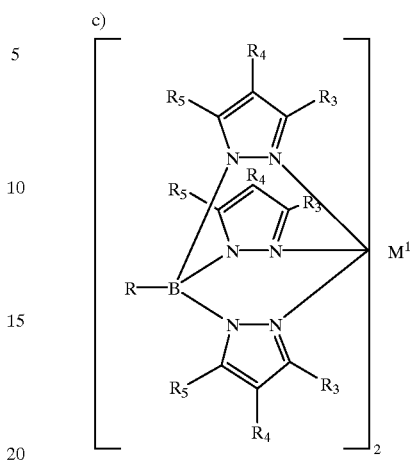

d)
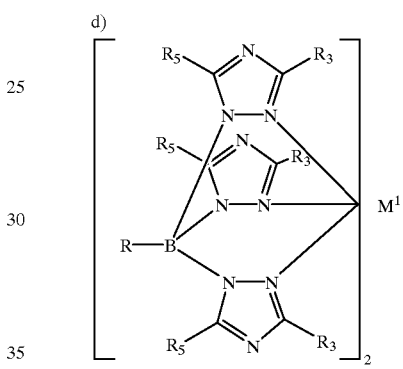

where in M for compounds represented by formulas (a) and (b) is a +3 metal while M for compounds represented by formulas (c) and (d) is a +2 metal; and $R_1$ through $R_1$ are independently selected from the group consisting of hydrogen, alkyl and aryl.

28. The display of claim 23, wherein each of said structures further includes:

a transparent substrate;

said LEDs each having a bottom and a top and defining a stack of LEDs having a bottom and a top, said stack being supported on said transparent substrate;

a first layer of substantially transparent, electrically conductive material, said first layer being disposed between said bottom LED and said transparent substrate;

at least one second layer of substantially transparent, electrically conductive material, said second layers being disposed between adjacent ones of said LEDs;

a first layer of electrically conductive material, said first layer being disposed adjacent the top of said top LED; and means on each of said layers of electrically conductive material for being connected to a bias for selectively energizing each of said LEDs.

29. The display of claim 23, further comprising:

a transparent substrate;

each of said LEDs having a top and a bottom;

at least two layers of substantially transparent, electrically conductive material, one of said layers being disposed on said transparent substrate;

the bottom of one of said LEDs in each of said structures being supported on said one layer of substantially transparent, electrically conductive material;

the others of said layers of substantially transparent, electrically conductive material being disposed between the remainder of said LEDs so that said LEDs define a stack;

a layer of electrically conductive material supported on the top of said LED in said stack that is furthest from said transparent substrate; and means on each of said layers of substantially transparent, electrically conductive material and on said layer electrically conductive material for being connected to a bias for selectively energizing each of said LEDs.

30. The display of claim 23, wherein said plurality of LED's comprise:

three LEDs;

each of said LEDs being a double heterostructure (DH);

said LED closest to said transparent substrate being operative when energized to emit blue light;

said LED furthest from said transparent substrate being operative when energized to emit red light; and said other LED being operative when energized to emit green light.

31. The display of claim 23, wherein said plurality of LED's include:

three LEDs;

each of said LEDs being single heterostructures (SH);

said LED closest to said transparent substrate being operative when energized to emit blue light;

said LED furthest from said transparent substrate being operative when energized to emit red light; and said other LED being operative when energized to emit green light.

32. A method of fabricating a multicolor, energizable light emitting structure having a top and a bottom in vertical alignment, comprising the steps of:

providing a transparent substrate between the top and bottom;

providing a first substantially transparent electrically conductive layer on said transparent substrate;

providing a first transparent, light emitting diode (LED) on said substrate having an emission layer comprising at least one emitting compound and at least one host compound capable of carrying electrons to the emitting compound, said first LED being operable when energized to emit a light of a first predetermined wavelength in a vertical path through the structure;

providing a second substantially transparent, electrically conductive layer on said first LED;

providing a second transparent, light emitting diode (LED) on said second substantially transparent, electrically conductive layer, said second (LED) comprising an emission layer comprising at least one of said emitting compounds and at least one of said host compounds being operable when energized to emit a light of a second predetermined wavelength in a vertical path through the structure, that is longer than said first predetermined wavelength; and an electrically conductive layer on said second (LED).

33. A method as in claim 32, wherein said steps of providing said first and second LEDs comprises the steps of forming each of said LEDs by;

depositing a hole transporting layer on said first and second substantially transparent, electrically conductive layers;

depositing said emission layer on each of said hole transporting layers; and depositing an electron transporting layer on each of said emission layers.

34. A method as in claim 32, further comprising:

providing an electrical contact on each of said layers of substantially transparent, electrically conductive material, and on said layer of electrically conductive material so that each of said layers can be connected to a source of bias potential.

35. A transparent energizable, light emitting device (LED), comprising:

an emission layer comprising at least one emitting compound and a matrix of at least one host compound capable of carrying electrons to the emitting compound, a hole transporting layer and an electron transporting layer;

said emission layer being disposed between said hole transporting layer and said electron transporting layer; and a first layer of substantially transparent electrically conductive material, and a second layer of electrically conductive material, said first layer being on said hole transporting layer, said second layer being on said electron transporting layer.

36. A multicolor light emitting device (LED) structure, comprising:

a plurality of at least a first and a second light emitting organic device (LED) stacked one upon the other, to form a layered structure, with each LED separated one from the other by a transparent conductive layer to enable each device to receive a separate bias potential to emit light through the stack, at least one of said LED's comprising an emission layer, said emission layer comprising at least one of a) a trivalent metal complex having the formula:

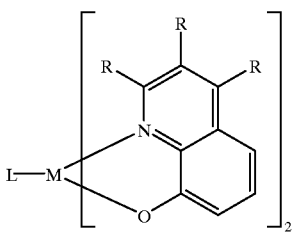

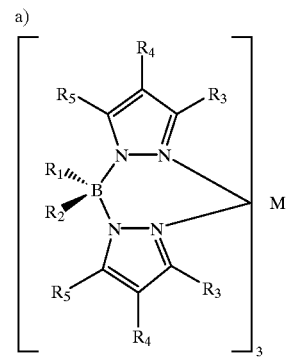

wherein R is selected from the group consisting of hydrogen, an alkyl group, an aryl group, and a heterocyclic group which may be substituted with at least one substituent selected from the group consisting of aryl, halogen, cyano and alkoxy; M is a trivalent metal ion; L is a ligand selected from the group consisting of picolylmethylketone; substituted and unsubstituted salicylaldehyde; a group of the formula R(O)CO— wherein R is as defined above, halogen; a group of the formula RO— wherein R is as defined above; bistriphenyl siloxides; and quinolates and derivatives thereof; and b) a trivalent metal bridged complex having the formula:

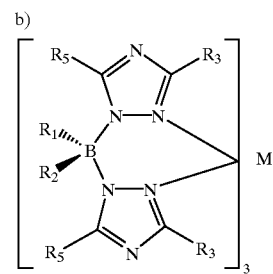

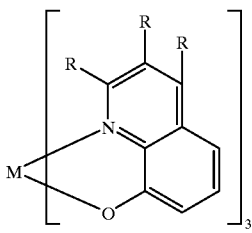

wherein R, M, A, $n_1$, $n_2$, $m_1$ and $m_2$ are as defined above, with the proviso that each R can not be hydrogen at the same time.

37. The multicolor LED structure of claim 36 wherein M is selected from the group consisting of $Al^3$, $Ga^{+3}$ and $In^{+3}$.

38. The multicolor LED structure of claim 36 wherein R is selected from the group consisting of methyl, ethyl, phenyl, pyridyl, imidazole, furan and thiophene.

39. The multicolor LED structure of claim 36 wherein L is selected from the group consisting of chloro, methyl carboxylate, salicylaldehyde substituted with barbituric acid, 8-hydroxyquinoline substituted with barbituric acid, and quinolate.

40. The multicolor LED structure of claim 36 wherein the emission layer further comprises a matrix formed from at least one host compound capable of carrying electrons to the emitting compound.

41. The multicolor LED structure of claim 40 wherein the host compound is selected from the group consisting of bis substituted borate complexes, tris substituted borate complexes and combinations thereof.

42. The multicolor LED structure of claim 40 wherein the host compound is selected from the group consisting of compounds of the following formulas:

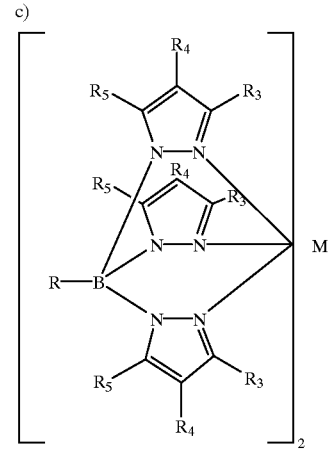

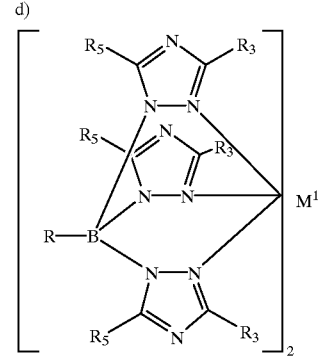

wherein M for compounds represented by formulas (a) and (b) is a +3 metal while $M^1$ for compounds represented by formulas (c) and (d) is a +2 metal; and $R_1$ through $R_5$ are independently selected from the group consisting of hydrogen, alkyl and aryl.

43. The multicolor LED structure of claim 42 wherein at least one of $R_1$ through $R_5$ is phenyl.

44. The multicolor LED structure of claim 40 wherein the mole % ratio of the emitting compound to the host compound is from about 0.01 to 50.0.

45. Compounds of the formulas:

a)
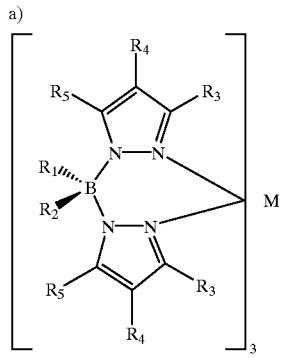

b)
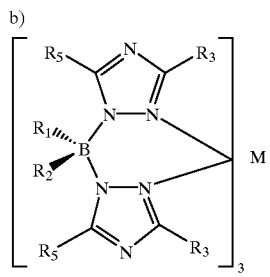

c)
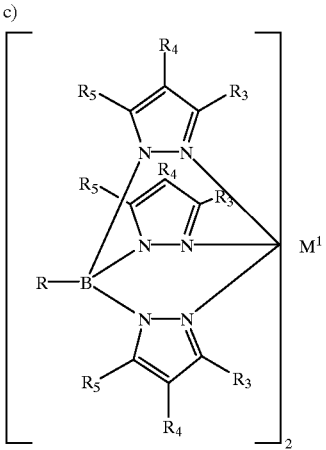

d)
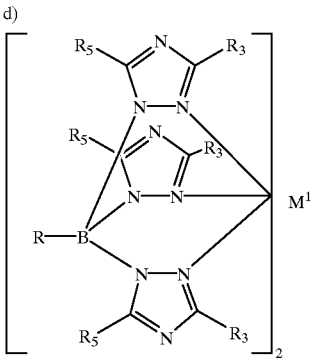

wherein M for compounds represented by formulas (a) and (b) is a +3 metal while $M^1$ for compounds represented by formulas (c) and (d) is a +2 metal; and $R_1$ through $R_5$ are independently selected from the group consisting of hydrogen, alkyl and aryl.

* * * * *